(12) United States Patent
Grube et al.

(10) Patent No.: US 9,684,558 B2
(45) Date of Patent: Jun. 20, 2017

(54) ACCESSING DATA STORED IN A DISPERSED STORAGE MEMORY

(71) Applicant: CLEVERSAFE, INC., Chicago, IL (US)

(72) Inventors: Gary W. Grube, Barrington Hills, IL (US); Timothy W. Markison, Mesa, AZ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/107,157

(22) Filed: Dec. 16, 2013

(65) Prior Publication Data

US 2014/0108890 A1 Apr. 17, 2014

Related U.S. Application Data

(62) Division of application No. 13/154,167, filed on Jun. 6, 2011, now Pat. No. 8,612,831.

(Continued)

(51) Int. Cl.
*G06F 11/10* (2006.01)
*H03M 13/35* (2006.01)
(Continued)

(52) U.S. Cl.
CPC .......... *G06F 11/10* (2013.01); *G06F 11/1076* (2013.01); *H03M 13/353* (2013.01);
(Continued)

(58) Field of Classification Search
CPC ........ H03M 13/3761; G06F 2211/1028; G06F 11/10
See application file for complete search history.

(56) References Cited

U.S. PATENT DOCUMENTS 5,596,589 A * 1/1997 Thomsen et al. ............. 714/759
7,412,585 B2 * 8/2008 Uemura ....................... 711/207
(Continued)

OTHER PUBLICATIONS

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

*Primary Examiner* — Steve Nguyen
(74) *Attorney, Agent, or Firm* — Garlick & Markison; Timothy W. Markison; Shayne X. Short

(57) ABSTRACT

A method begins by a processing module forward error correction (FEC) encoding data to produce FEC encoded data and dividing the FEC encoded data into a set of FEC encoded words. The method continues with the processing module generating integrity information based on the data and generating a word name for an FEC encoded word of the set of FEC encoded words. The method continues with the processing module affiliating an address of allocated address space of a dispersed storage memory with the word name and storing the integrity information, the word name, and the address. The method continues with the processing module creating a write command to store the FEC encoded word at the address in the dispersed storage memory.

8 Claims, 13 Drawing Sheets

Related U.S. Application Data

(60) Provisional application No. 61/357,390, filed on Jun. 22, 2010.

(51) Int. Cl.
*H03M 13/37* (2006.01)
*G06F 11/34* (2006.01)
*H03M 13/09* (2006.01)
*H03M 13/15* (2006.01)
*H03M 13/23* (2006.01)

(52) U.S. Cl.
CPC ..... *H03M 13/3761* (2013.01); *G06F 11/3409* (2013.01); *G06F 2211/1028* (2013.01); *H03M 13/09* (2013.01); *H03M 13/1515* (2013.01); *H03M 13/23* (2013.01)

(56) References Cited

U.S. PATENT DOCUMENTS

| | | | |
|---|---|---|---|
| 7,636,724 B2 | 12/2009 | de la Torre et al. | |
| 7,827,459 B1* | 11/2010 | Zhou et al. | 714/749 |
| 8,464,142 B2* | 6/2013 | Gunnam et al. | 714/786 |
| 2009/0094250 A1* | 4/2009 | Dhuse | G06F 11/1004 |
| 2009/0094318 A1* | 4/2009 | Gladwin | H04L 67/1097 |
| | | | 709/203 |

* cited by examiner computing system 10

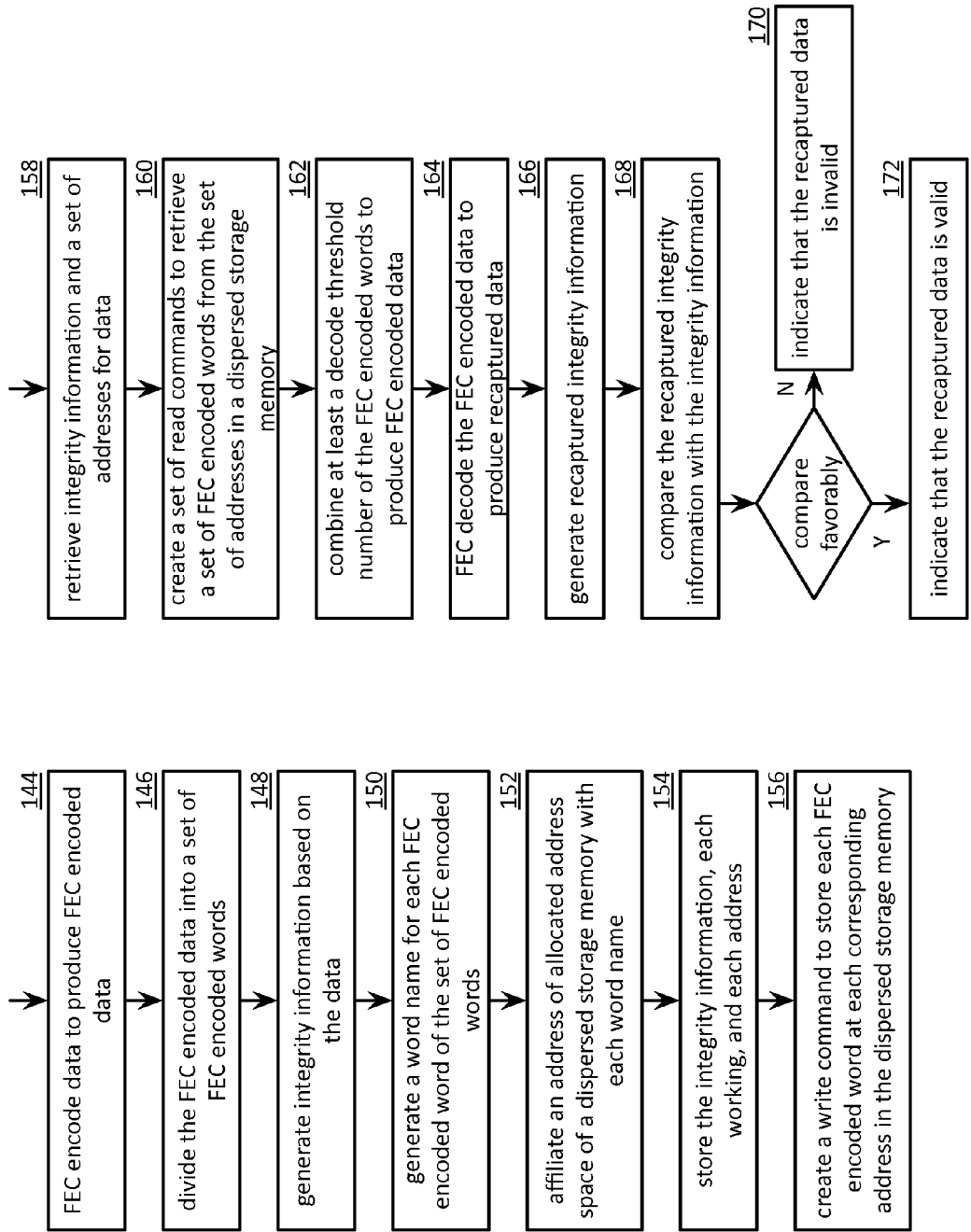

ACCESSING DATA STORED IN A DISPERSED STORAGE MEMORY

CROSS REFERENCE TO RELATED PATENTS

The present U.S. Utility Patent Application claims priority pursuant to 35 U.S.C. §120, as a divisional, to the following U.S. Utility Patent Application which is hereby incorporated herein by reference in its entirety and made part of the present U.S. Utility Patent Application for all purposes:

1. U.S. Utility application Ser. No. 13/154,167, entitled "ACCESSING DATA STORED IN A DISPERSED STORAGE MEMORY," filed Jun. 6, 2011, issuing as U.S. Pat. No. 8,612,831 on Dec. 17, 2013, which claims priority pursuant to 35 U.S.C. §119(e) to the following U.S. Provisional Patent Application which is hereby incorporated herein by reference in its entirety and made part of the present U.S. Utility Patent Application for all purposes:
   a. U.S. Provisional Application Ser. No. 61/357,390, entitled "DISTRIBUTED STORAGE UTILIZING SIMPLE STORAGE UNITS," filed Jun. 22, 2010.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND OF THE INVENTION

Technical Field of the Invention

This invention relates generally to computing systems and more particularly to data storage solutions within such computing systems.

Description of Related Art

Computers are known to communicate, process, and store data. Such computers range from wireless smart phones to data centers that support millions of web searches, stock trades, or on-line purchases every day. In general, a computing system generates data and/or manipulates data from one form into another. For instance, an image sensor of the computing system generates raw picture data and, using an image compression program (e.g., JPEG, MPEG, etc.), the computing system manipulates the raw picture data into a standardized compressed image.

With continued advances in processing speed and communication speed, computers are capable of processing real time multimedia data for applications ranging from simple voice communications to streaming high definition video. As such, general-purpose information appliances are replacing purpose-built communications devices (e.g., a telephone). For example, smart phones can support telephony communications but they are also capable of text messaging and accessing the internet to perform functions including email, web browsing, remote applications access, and media communications (e.g., telephony voice, image transfer, music files, video files, real time video streaming. etc.).

Each type of computer is constructed and operates in accordance with one or more communication, processing, and storage standards. As a result of standardization and with advances in technology, more and more information content is being converted into digital formats. For example, more digital cameras are now being sold than film cameras, thus producing more digital pictures. As another example, web-based programming is becoming an alternative to over the air television broadcasts and/or cable broadcasts. As further examples, papers, books, video entertainment, home video, etc. are now being stored digitally, which increases the demand on the storage function of computers.

A typical computer storage system includes one or more memory devices aligned with the needs of the various operational aspects of the computer's processing and communication functions. Generally, the immediacy of access dictates what type of memory device is used. For example, random access memory (RAM) memory can be accessed in any random order with a constant response time, thus it is typically used for cache memory and main memory. By contrast, memory device technologies that require physical movement such as magnetic disks, tapes, and optical discs, have a variable response time as the physical movement can take longer than the data transfer, thus they are typically used for secondary memory (e.g., hard drive, backup memory, etc.).

A computer's storage system will be compliant with one or more computer storage standards that include, but are not limited to, network file system (NFS), flash file system (FFS), disk file system (DFS), small computer system interface (SCSI), internet small computer system interface (iSCSI), file transfer protocol (FTP), and web-based distributed authoring and versioning (WebDAV). These standards specify the data storage format (e.g., files, data objects, data blocks, directories, etc.) and interfacing between the computer's processing function and its storage system, which is a primary function of the computer's memory controller.

Despite the standardization of the computer and its storage system, memory devices fail; especially commercial grade memory devices that utilize technologies incorporating physical movement (e.g., a disc drive). For example, it is fairly common for a disc drive to routinely suffer from bit level corruption and to completely fail after three years of use. One solution is to utilize a higher-grade disc drive, which adds significant cost to a computer.

Another solution is to utilize multiple levels of redundant disc drives to replicate the data into two or more copies. One such redundant drive approach is called redundant array of independent discs (RAID). In a RAID device, a RAID controller adds parity data to the original data before storing it across the array. The parity data is calculated from the original data such that the failure of a disc will not result in the loss of the original data. For example, RAID 5 uses three discs to protect data from the failure of a single disc. The parity data, and associated redundancy overhead data, reduces the storage capacity of three independent discs by one third (e.g., n−1=capacity). RAID 6 can recover from a loss of two discs and requires a minimum of four discs with a storage capacity of n−2.

While RAID addresses the memory device failure issue, it is not without its own failure issues that affect its effectiveness, efficiency and security. For instance, as more discs are added to the array, the probability of a disc failure increases, which increases the demand for maintenance. For example, when a disc fails, it needs to be manually replaced before another disc fails and the data stored in the RAID device is lost. To reduce the risk of data loss, data on a RAID device is typically copied on to one or more other RAID devices. While this addresses the loss of data issue, it raises a security issue since multiple copies of data are available, which increases the chances of unauthorized access. Further, as the amount of data being stored grows, the overhead of RAID devices becomes a non-trivial efficiency issue.

BRIEF DESCRIPTION OF THE SEVERAL VIEWS OF THE DRAWING(S)

FIG. 9A is another flowchart illustrating another example of storing data in accordance with the invention;

FIG. 9B is another flowchart illustrating another example of retrieving data in accordance with the invention;

DETAILED DESCRIPTION OF THE INVENTION

Figure 1:
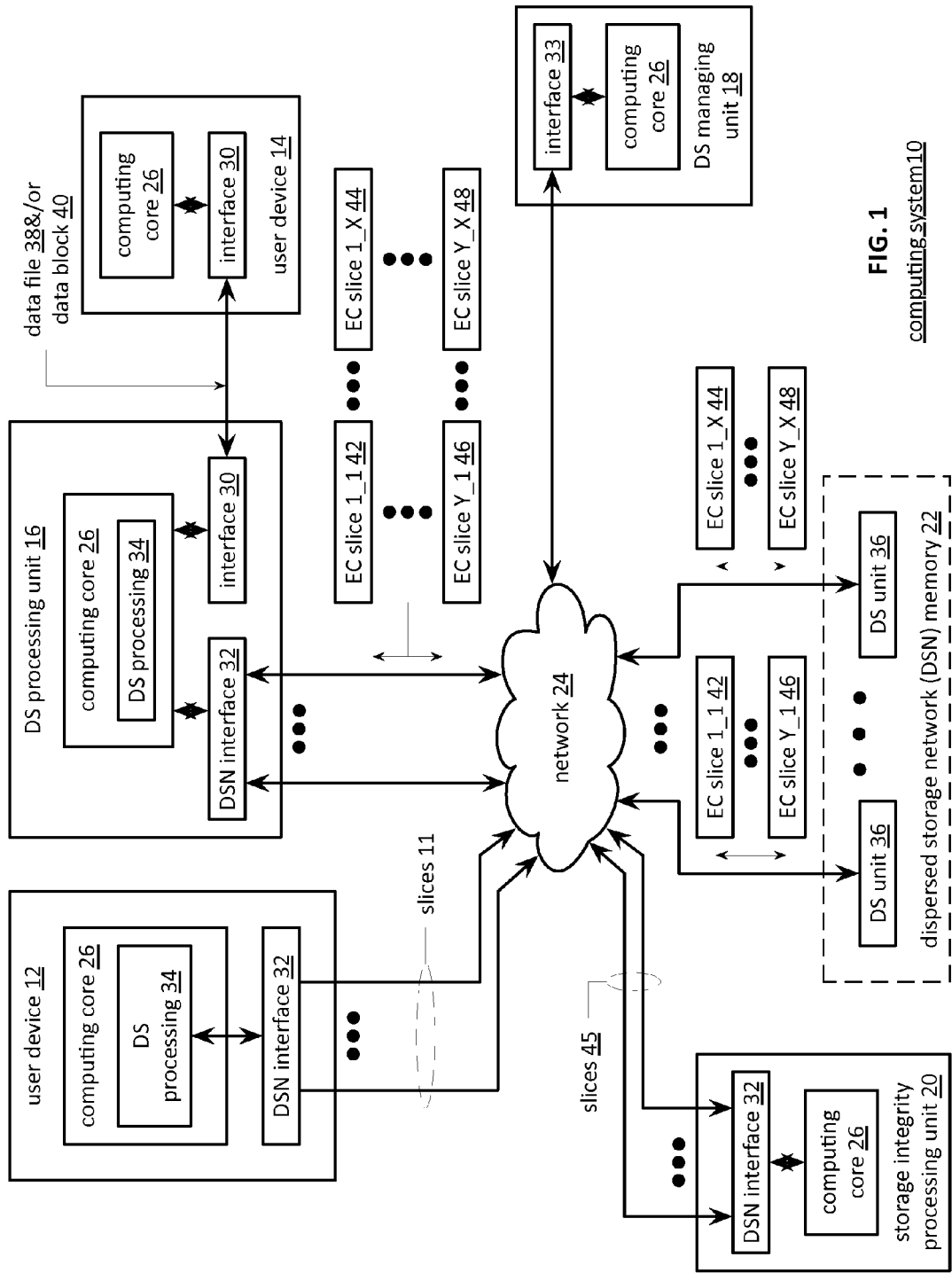
FIG. 1 is a schematic block diagram of an embodiment of a computing system in accordance with the invention.

FIG. 1 is a schematic block diagram of a computing system 10 that includes one or more of a first type of user devices 12, one or more of a second type of user devices 14, at least one distributed storage (DS) processing unit 16, at least one DS managing unit 18, at least one storage integrity processing unit 20, and a distributed storage network (DSN) memory 22 coupled via a network 24. The network 24 may include one or more wireless and/or wire lined communication systems; one or more private intranet systems and/or public internet systems; and/or one or more local area networks (LAN) and/or wide area networks (WAN).

The DSN memory 22 includes a plurality of distributed storage (DS) units 36 for storing data of the system. Each of the DS units 36 includes a processing module and memory and may be located at a geographically different site than the other DS units (e.g., one in Chicago, one in Milwaukee, etc.). The processing module may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module may have an associated memory and/or memory element, which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that if the processing module includes more than one processing device, the processing devices may be centrally located (e.g., directly coupled together via a wired and/or wireless bus structure) or may be distributedly located (e.g., cloud computing via indirect coupling via a local area network and/or a wide area network). Further note that when the processing module implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element stores, and the processing module executes, hard coded and/or operational instructions corresponding to at least some of the steps and/or functions illustrated in FIGS. 1-13.

Each of the user devices 12-14, the DS processing unit 16, the DS managing unit 18, and the storage integrity processing unit 20 may be a portable computing device (e.g., a social networking device, a gaming device, a cell phone, a smart phone, a personal digital assistant, a digital music player, a digital video player, a laptop computer, a handheld computer, a video game controller, and/or any other portable device that includes a computing core) and/or a fixed computing device (e.g., a personal computer, a computer server, a cable set-top box, a satellite receiver, a television set, a printer, a fax machine, home entertainment equipment, a video game console, and/or any type of home or office computing equipment). Such a portable or fixed computing device includes a computing core 26 and one or more interfaces 30, 32, and/or 33. An embodiment of the computing core 26 will be described with reference to FIG. 2.

With respect to the interfaces, each of the interfaces 30, 32, and 33 includes software and/or hardware to support one or more communication links via the network 24 and/or directly. For example, interface 30 supports a communication link (wired, wireless, direct, via a LAN, via the network 24, etc.) between the first type of user device 14 and the DS processing unit 16. As another example, DSN interface 32 supports a plurality of communication links via the network 24 between the DSN memory 22 and the DS processing unit 16, the first type of user device 12, and/or the storage integrity processing unit 20. As yet another example, interface 33 supports a communication link between the DS managing unit 18 and any one of the other devices and/or units 12, 14, 16, 20, and/or 22 via the network 24.

In general and with respect to data storage, the system 10 supports three primary functions: distributed network data storage management, distributed data storage and retrieval, and data storage integrity verification. In accordance with these three primary functions, data can be distributedly stored in a plurality of physically different locations and subsequently retrieved in a reliable and secure manner regardless of failures of individual storage devices, failures of network equipment, the duration of storage, the amount of data being stored, attempts at hacking the data, etc.

The DS managing unit 18 performs distributed network data storage management functions, which include establishing distributed data storage parameters, performing network operations, performing network administration, and/or performing network maintenance. The DS managing unit 18 establishes the distributed data storage parameters (e.g., allocation of virtual DSN memory space, distributed storage parameters, security parameters, billing information, user profile information, etc.) for one or more of the user devices 12-14 (e.g., established for individual devices, established for a user group of devices, established for public access by the user devices, etc.). For example, the DS managing unit 18 coordinates the creation of a vault (e.g., a virtual memory block) within the DSN memory 22 for a user device (for a group of devices, or for public access). The DS managing unit 18 also determines the distributed data storage parameters for the vault. In particular, the DS managing unit 18 determines a number of slices (e.g., the number that a data segment of a data file and/or data block is partitioned into for distributed storage) and a read threshold value (e.g., the minimum number of slices required to reconstruct the data segment).

As another example, the DS managing unit 18 creates and stores, locally or within the DSN memory 22, user profile information. The user profile information includes one or more of authentication information, permissions, and/or the security parameters. The security parameters may include one or more of encryption/decryption scheme, one or more encryption keys, key generation scheme, and data encoding/decoding scheme.

As yet another example, the DS managing unit 18 creates billing information for a particular user, user group, vault access, public vault access, etc. For instance, the DS managing unit 18 tracks the number of times a user accesses a private vault and/or public vaults, which can be used to generate a per-access bill. In another instance, the DS managing unit 18 tracks the amount of data stored and/or retrieved by a user device and/or a user group, which can be used to generate a per-data-amount bill.

The DS managing unit 18 also performs network operations, network administration, and/or network maintenance. As at least part of performing the network operations and/or administration, the DS managing unit 18 monitors performance of the devices and/or units of the system 10 for potential failures, determines the devices' and/or units' activation status, determines the devices' and/or units' loading, and any other system level operation that affects the performance level of the system 10. For example, the DS managing unit 18 receives and aggregates network management alarms, alerts, errors, status information, performance information, and messages from the devices 12-14 and/or the units 16, 20, 22. For example, the DS managing unit 18 receives a simple network management protocol (SNMP) message regarding the status of the DS processing unit 16.

The DS managing unit 18 performs the network maintenance by identifying equipment within the system 10 that needs replacing, upgrading, repairing, and/or expanding. For example, the DS managing unit 18 determines that the DSN memory 22 needs more DS units 36 or that one or more of the DS units 36 needs updating.

The second primary function (i.e., distributed data storage and retrieval) begins and ends with a user device 12-14. For instance, if a second type of user device 14 has a data file 38 and/or data block 40 to store in the DSN memory 22, it sends the data file 38 and/or data block 40 to the DS processing unit 16 via its interface 30. As will be described in greater detail with reference to FIG. 2, the interface 30 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). In addition, the interface 30 may attach a user identification code (ID) to the data file 38 and/or data block 40.

The DS processing unit 16 receives the data file 38 and/or data block 40 via its interface 30 and performs a distributed storage (DS) process 34 thereon (e.g., an error coding dispersal storage function). The DS processing 34 begins by partitioning the data file 38 and/or data block 40 into one or more data segments, which is represented as Y data segments. For example, the DS processing 34 may partition the data file 38 and/or data block 40 into a fixed byte size segment (e.g., $2^1$ to $2^n$ bytes, where n=>2) or a variable byte size (e.g., change byte size from segment to segment, or from groups of segments to groups of segments, etc.).

For each of the Y data segments, the DS processing 34 error encodes (e.g., forward error correction (FEC), information dispersal algorithm, or error correction coding) and slices (or slices then error encodes) the data segment into a plurality of error coded (EC) data slices 42-48, which is represented as X slices per data segment. The number of slices (X) per segment, which corresponds to a number of pillars n, is set in accordance with the distributed data storage parameters and the error coding scheme. For example, if a Reed-Solomon (or other FEC scheme) is used in an n/k system, then a data segment is divided into n slices, where k number of slices is needed to reconstruct the original data (i.e., k is the threshold). As a few specific examples, the n/k factor may be 5/3; 6/4; 8/6; 8/5; 16/10.

For each EC slice 42-48, the DS processing unit 16 creates a unique slice name and appends it to the corresponding EC slice 42-48. The slice name includes universal DSN memory addressing routing information (e.g., virtual memory addresses in the DSN memory 22) and user-specific information (e.g., user ID, file name, data block identifier, etc.).

The DS processing unit 16 transmits the plurality of EC slices 42-48 to a plurality of DS units 36 of the DSN memory 22 via the DSN interface 32 and the network 24. The DSN interface 32 formats each of the slices for transmission via the network 24. For example, the DSN interface 32 may utilize an internet protocol (e.g., TCP/IP, etc.) to packetize the EC slices 42-48 for transmission via the network 24.

The number of DS units 36 receiving the EC slices 42-48 is dependent on the distributed data storage parameters established by the DS managing unit 18. For example, the DS managing unit 18 may indicate that each slice is to be stored in a different DS unit 36. As another example, the DS managing unit 18 may indicate that like slice numbers of different data segments are to be stored in the same DS unit 36. For example, the first slice of each of the data segments is to be stored in a first DS unit 36, the second slice of each of the data segments is to be stored in a second DS unit 36, etc. In this manner, the data is encoded and distributedly stored at physically diverse locations to improve data storage integrity and security. Further examples of encoding the data segments will be provided with reference to one or more of FIGS. 2-13.

Each DS unit 36 that receives an EC slice 42-48 for storage translates the virtual DSN memory address of the slice into a local physical address for storage. Accordingly, each DS unit 36 maintains a virtual to physical memory mapping to assist in the storage and retrieval of data.

The first type of user device 12 performs a similar function to store data in the DSN memory 22 with the exception that it includes the DS processing. As such, the device 12 encodes and slices the data file and/or data block it has to store. The device then transmits the slices 11 to the DSN memory via its DSN interface 32 and the network 24.

For a second type of user device 14 to retrieve a data file or data block from memory, it issues a read command via its interface 30 to the DS processing unit 16. The DS processing unit 16 performs the DS processing 34 to identify the DS units 36 storing the slices of the data file and/or data block based on the read command. The DS processing unit 16 may also communicate with the DS managing unit 18 to verify that the user device 14 is authorized to access the requested data.

Assuming that the user device is authorized to access the requested data, the DS processing unit 16 issues slice read commands to at least a threshold number of the DS units 36 storing the requested data (e.g., to at least 10 DS units for a 16/10 error coding scheme). Each of the DS units 36 receiving the slice read command, verifies the command, accesses its virtual to physical memory mapping, retrieves the requested slice, or slices, and transmits it to the DS processing unit 16.

Once the DS processing unit 16 has received a read threshold number of slices for a data segment, it performs an error decoding function and de-slicing to reconstruct the data segment. When Y number of data segments has been reconstructed, the DS processing unit 16 provides the data file 38 and/or data block 40 to the user device 14. Note that the first type of user device 12 performs a similar process to retrieve a data file and/or data block.

The storage integrity processing unit 20 performs the third primary function of data storage integrity verification. In general, the storage integrity processing unit 20 periodically retrieves slices 45, and/or slice names, of a data file or data block of a user device to verify that one or more slices have not been corrupted or lost (e.g., the DS unit failed). The retrieval process mimics the read process previously described.

If the storage integrity processing unit 20 determines that one or more slices is corrupted or lost, it rebuilds the corrupted or lost slice(s) in accordance with the error coding scheme. The storage integrity processing unit 20 stores the rebuilt slice, or slices, in the appropriate DS unit(s) 36 in a manner that mimics the write process previously described.

Figure 2:
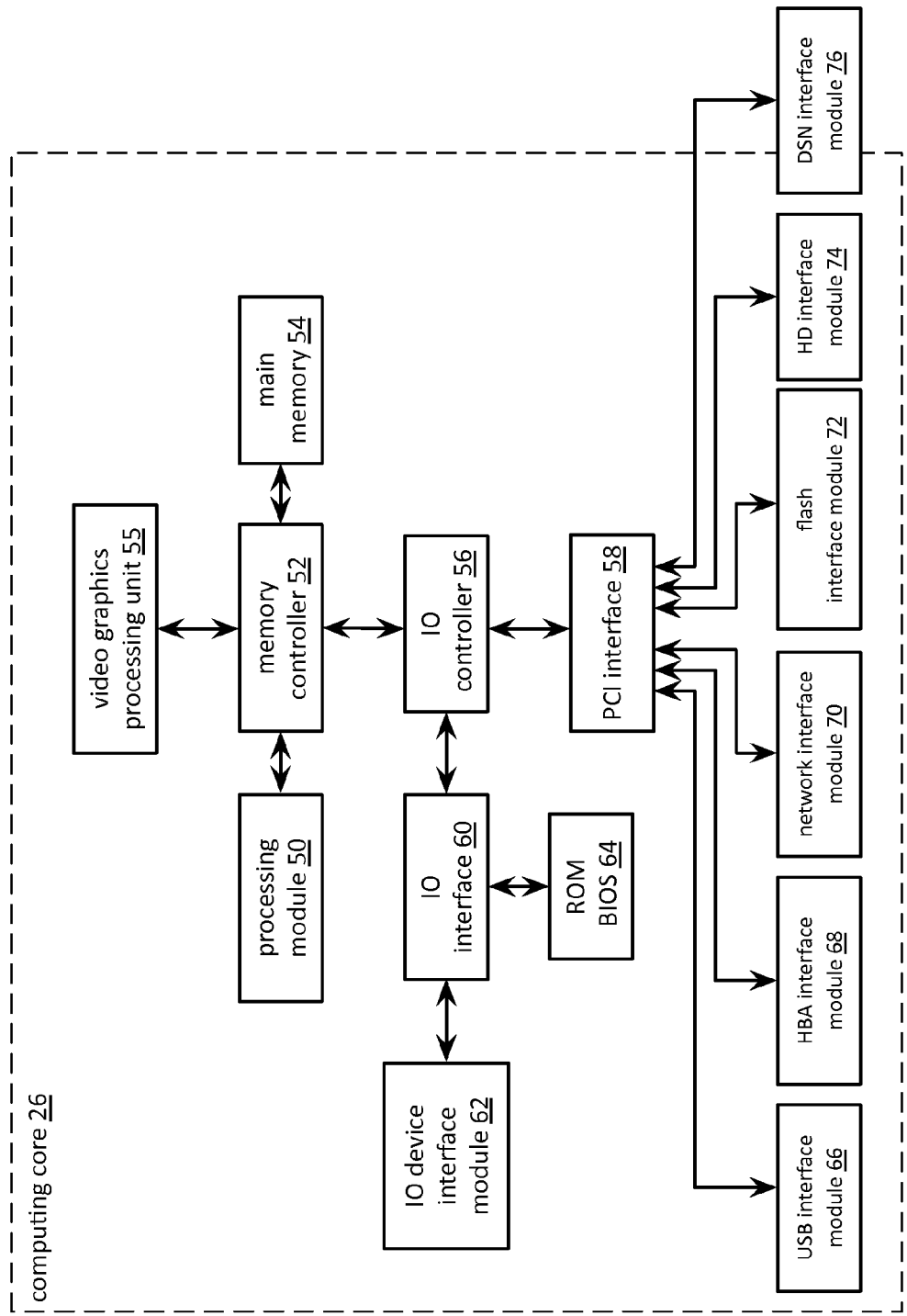
FIG. 2 is a schematic block diagram of an embodiment of a computing core in accordance with the invention.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface 60, at least one IO device interface module 62, a read only memory (ROM) basic input output system (BIOS) 64, and one or more memory interface modules. The memory interface module(s) includes one or more of a universal serial bus (USB) interface module 66, a host bus adapter (HBA) interface module 68, a network interface module 70, a flash interface module 72, a hard drive interface module 74, and a DSN interface module 76. Note the DSN interface module 76 and/or the network interface module 70 may function as the interface 30 of the user device 14 of FIG. 1. Further note that the IO device interface module 62 and/or the memory interface modules may be collectively or individually referred to as IO ports.

The processing module 50 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module 50 may have an associated memory and/or memory element, which may be a single memory device, a plurality of memory devices, and/or embedded circuitry of the processing module 50. Such a memory device may be a read-only memory, random access memory, volatile memory, non-volatile memory, static memory, dynamic memory, flash memory, cache memory, and/or any device that stores digital information. Note that if the processing module 50 includes more than one processing device, the processing devices may be centrally located (e.g., directly coupled together via a wired and/or wireless bus structure) or may be distributedly located (e.g., cloud computing via indirect coupling via a local area network and/or a wide area network). Further note that when the processing module 50 implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element stores, and the processing module 50 executes, hard coded and/or operational instructions corresponding to at least some of the steps and/or functions illustrated in FIGS. 1-13.

Figure 3:
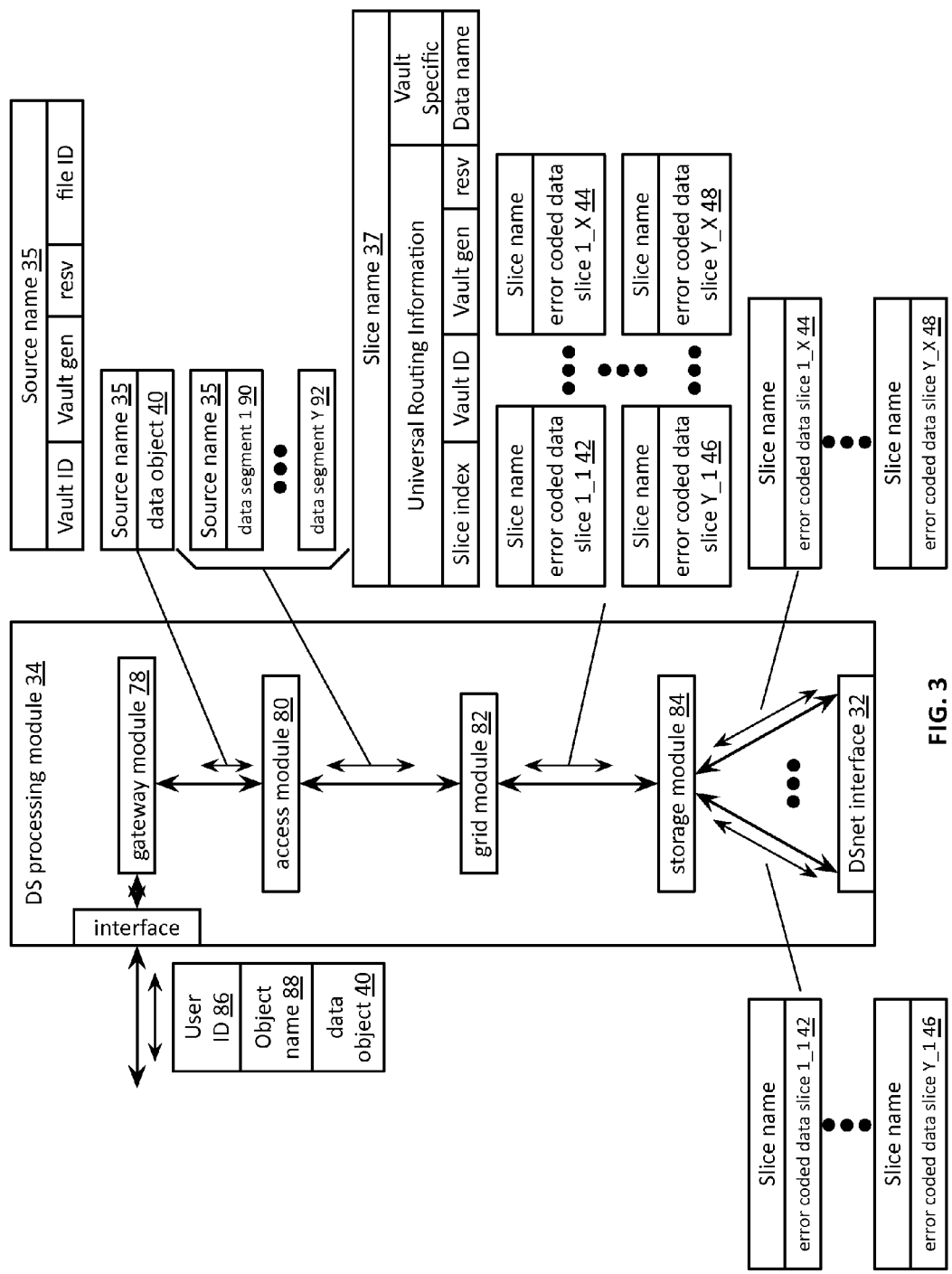
FIG. 3 is a schematic block diagram of an embodiment of a distributed storage processing unit in accordance with the invention.

FIG. 3 is a schematic block diagram of an embodiment of a dispersed storage (DS) processing module 34 of user device 12 and/or of the DS processing unit 16. The DS processing module 34 includes a gateway module 78, an access module 80, a grid module 82, and a storage module 84. The DS processing module 34 may also include an interface 30 and the DSnet interface 32 or the interfaces 68 and/or 70 may be part of user device 12 or of the DS processing unit 16. The DS processing module 34 may further include a bypass/feedback path between the storage module 84 to the gateway module 78. Note that the modules 78-84 of the DS processing module 34 may be in a single unit or distributed across multiple units.

In an example of storing data, the gateway module 78 receives an incoming data object that includes a user ID field 86, an object name field 88, and the data object field 40 and may also receive corresponding information that includes a process identifier (e.g., an internal process/application ID), metadata, a file system directory, a block number, a transaction message, a user device identity (ID), a data object identifier, a source name, and/or user information. The gateway module 78 authenticates the user associated with the data object by verifying the user ID 86 with the DS managing unit 18 and/or another authenticating unit.

When the user is authenticated, the gateway module 78 obtains user information from the management unit 18, the user device, and/or the other authenticating unit. The user information includes a vault identifier, operational parameters, and user attributes (e.g., user data, billing information, etc.). A vault identifier identifies a vault, which is a virtual memory space that maps to a set of DS storage units 36. For example, vault 1 (i.e., user 1's DSN memory space) includes eight DS storage units (X=8 wide) and vault 2 (i.e., user 2's DSN memory space) includes sixteen DS storage units (X=16 wide). The operational parameters may include an error coding algorithm, the width n (number of pillars X or slices per segment for this vault), a read threshold T, a write threshold, an encryption algorithm, a slicing parameter, a compression algorithm, an integrity check method, caching settings, parallelism settings, and/or other parameters that may be used to access the DSN memory layer.

The gateway module 78 uses the user information to assign a source name 35 to the data. For instance, the gateway module 78 determines the source name 35 of the data object 40 based on the vault identifier and the data object. For example, the source name may contain a file identifier (ID), a vault generation number, a reserved field, and a vault identifier (ID). As another example, the gateway module 78 may generate the file ID based on a hash function of the data object 40. Note that the gateway module 78 may also perform message conversion, protocol conversion, electrical conversion, optical conversion, access control, user identification, user information retrieval, traffic monitoring, statistics generation, configuration, management, and/or source name determination.

The access module 80 receives the data object 40 and creates a series of data segments 1 through Y 90-92 in accordance with a data storage protocol (e.g., file storage system, a block storage system, and/or an aggregated block storage system). The number of segments Y may be chosen or randomly assigned based on a selected segment size and the size of the data object. For example, if the number of segments is chosen to be a fixed number, then the size of the segments varies as a function of the size of the data object. For instance, if the data object is an image file of 4,194,304 eight bit bytes (e.g., 33,554,432 bits) and the number of segments Y=131,072, then each segment is 256 bits or 32 bytes. As another example, if segment size is fixed, then the number of segments Y varies based on the size of data object. For instance, if the data object is an image file of 4,194,304 bytes and the fixed size of each segment is 4,096 bytes, then the number of segments Y=1,024. Note that each segment is associated with the same source name.

The grid module 82 receives the data segments and may manipulate (e.g., compression, encryption, cyclic redundancy check (CRC), etc.) each of the data segments before performing an error coding function of the error coding dispersal storage function to produce a pre-manipulated data segment. After manipulating a data segment, if applicable, the grid module 82 error encodes (e.g., Reed-Solomon, Convolution encoding, Trellis encoding, etc.) the data segment or manipulated data segment into X error coded data slices 42-44.

The value X, or the number of pillars (e.g., X=16), is chosen as a parameter of the error coding dispersal storage function. Other parameters of the error coding dispersal function include a read threshold T, a write threshold W, etc. The read threshold (e.g., T=10, when X=16) corresponds to the minimum number of error-free error coded data slices required to reconstruct the data segment. In other words, the DS processing module 34 can compensate for X−T (e.g., 16−10=6) missing error coded data slices per data segment. The write threshold W corresponds to a minimum number of DS storage units that acknowledge proper storage of their respective data slices before the DS processing module indicates proper storage of the encoded data segment. Note that the write threshold is greater than or equal to the read threshold for a given number of pillars (X).

For each data slice of a data segment, the grid module 82 generates a unique slice name 37 and attaches it thereto. The slice name 37 includes a universal routing information field and a vault specific field and may be 48 bytes (e.g., 24 bytes for each of the universal routing information field and the vault specific field). As illustrated, the universal routing information field includes a slice index, a vault ID, a vault generation, and a reserved field. The slice index is based on the pillar number and the vault ID and, as such, is unique for each pillar (e.g., slices of the same pillar for the same vault for any segment will share the same slice index). The vault specific field includes a data name, which includes a file ID and a segment number (e.g., a sequential numbering of data segments 1-Y of a simple data object or a data block number).

Prior to outputting the error coded data slices of a data segment, the grid module may perform post-slice manipulation on the slices. If enabled, the manipulation includes slice level compression, encryption, CRC, addressing, tagging, and/or other manipulation to improve the effectiveness of the computing system.

When the error coded data slices of a data segment are ready to be outputted, the grid module 82 determines which of the DS storage units 36 will store the EC data slices based on a dispersed storage memory mapping associated with the user's vault and/or DS storage unit 36 attributes. The DS storage unit attributes may include availability, self-selection, performance history, link speed, link latency, ownership, available DSN memory, domain, cost, a prioritization scheme, a centralized selection message from another source, a lookup table, data ownership, and/or any other factor to optimize the operation of the computing system. Note that the number of DS storage units 36 is equal to or greater than the number of pillars (e.g., X) so that no more than one error coded data slice of the same data segment is stored on the same DS storage unit 36. Further note that EC data slices of the same pillar number but of different segments (e.g., EC data slice 1 of data segment 1 and EC data slice 1 of data segment 2) may be stored on the same or different DS storage units 36.

The storage module 84 performs an integrity check on the outbound encoded data slices and, when successful, identifies a plurality of DS storage units based on information provided by the grid module 82. The storage module 84 then outputs the encoded data slices 1 through X of each segment 1 through Y to the DS storage units 36. Each of the DS storage units 36 stores its EC data slice(s) and maintains a local virtual DSN address to physical location table to convert the virtual DSN address of the EC data slice(s) into physical storage addresses.

In an example of a read operation, the user device 12 and/or 14 sends a read request to the DS processing unit 16, which authenticates the request. When the request is authentic, the DS processing unit 16 sends a read message to each of the DS storage units 36 storing slices of the data object being read. The slices are received via the DSnet interface 32 and processed by the storage module 84, which performs a parity check and provides the slices to the grid module 82 when the parity check was successful. The grid module 82 decodes the slices in accordance with the error coding dispersal storage function to reconstruct the data segment. The access module 80 reconstructs the data object from the data segments and the gateway module 78 formats the data object for transmission to the user device.

Figures 4, 5:
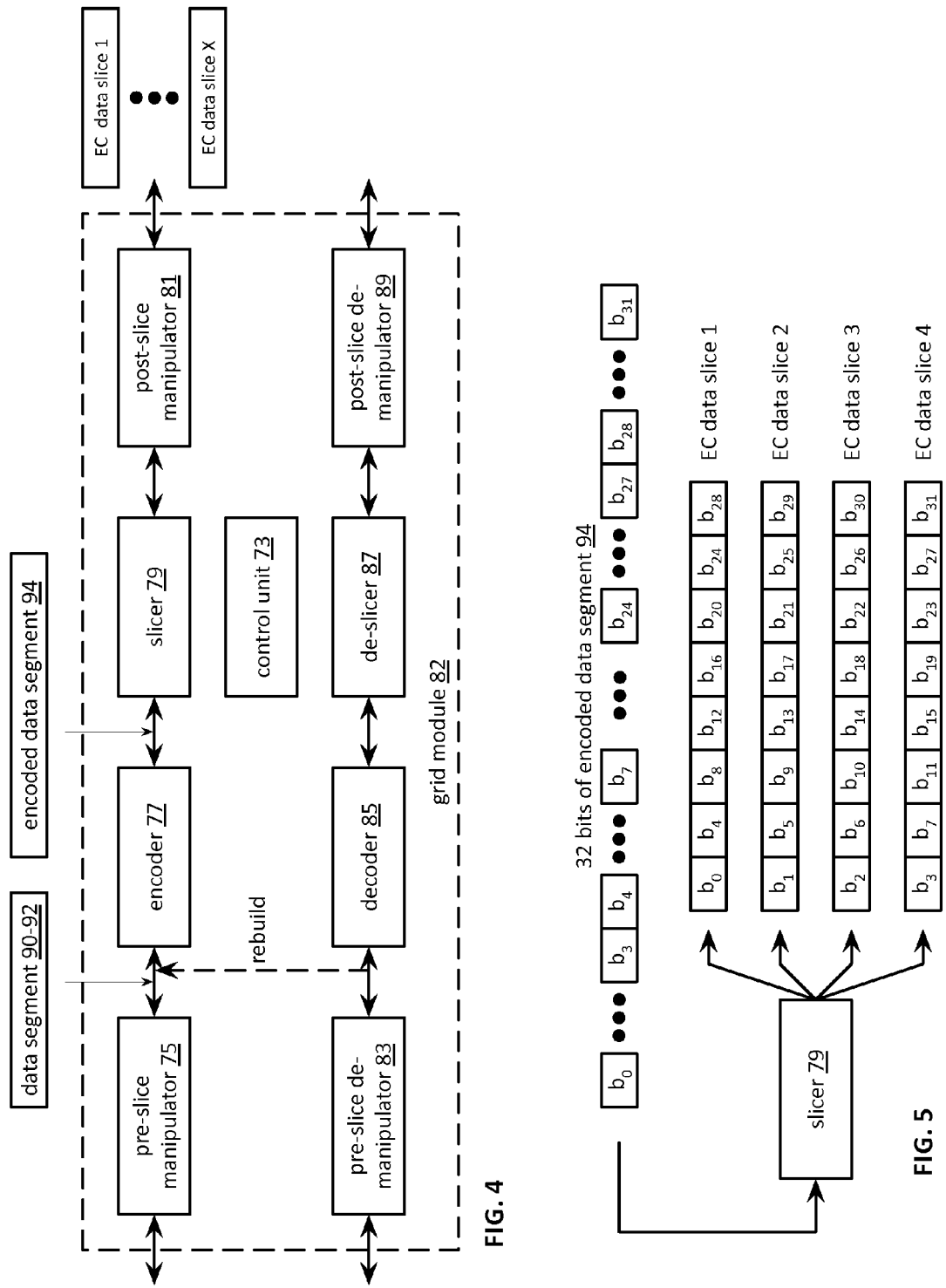
FIG. 4 is a schematic block diagram of an embodiment of a grid module in accordance with the invention.
FIG. 5 is a diagram of an example embodiment of error coded data slice creation in accordance with the invention.

FIG. 4 is a schematic block diagram of an embodiment of a grid module 82 that includes a control unit 73, a pre-slice manipulator 75, an encoder 77, a slicer 79, a post-slice manipulator 81, a pre-slice de-manipulator 83, a decoder 85, a de-slicer 87, and/or a post-slice de-manipulator 89. Note that the control unit 73 may be partially or completely external to the grid module 82. For example, the control unit 73 may be part of the computing core at a remote location, part of a user device, part of the DS managing unit 18, or distributed amongst one or more DS storage units.

In an example of a write operation, the pre-slice manipulator 75 receives a data segment 90-92 and a write instruction from an authorized user device. The pre-slice manipulator 75 determines if pre-manipulation of the data segment 90-92 is required and, if so, what type. The pre-slice manipulator 75 may make the determination independently or based on instructions from the control unit 73, where the determination is based on a computing system-wide predetermination, a table lookup, vault parameters associated with the user identification, the type of data, security requirements, available DSN memory, performance requirements, and/or other metadata.

Once a positive determination is made, the pre-slice manipulator 75 manipulates the data segment 90-92 in accordance with the type of manipulation. For example, the type of manipulation may be compression (e.g., Lempel-Ziv-Welch, Huffman, Golomb, fractal, wavelet, etc.), signatures (e.g., Digital Signature Algorithm (DSA), Elliptic Curve DSA, Secure Hash Algorithm, etc.), watermarking, tagging, encryption (e.g., Data Encryption Standard, Advanced Encryption Standard, etc.), adding metadata (e.g., time/date stamping, user information, file type, etc.), cyclic redundancy check (e.g., CRC32), and/or other data manipulations to produce the pre-manipulated data segment.

The encoder 77 encodes the pre-manipulated data segment 92 using a forward error correction (FEC) encoder (and/or other type of erasure coding and/or error coding) to produce an encoded data segment 94. The encoder 77 determines which forward error correction algorithm to use based on a predetermination associated with the user's vault, a time based algorithm, user direction, DS managing unit direction, control unit direction, as a function of the data type, as a function of the data segment 92 metadata, and/or any other factor to determine algorithm type. The forward error correction algorithm may be Golay, Multidimensional parity, Reed-Solomon, Hamming, Bose Ray Chauduri Hocquenghem (BCH), Cauchy-Reed-Solomon, or any other FEC encoder. Note that the encoder 77 may use a different encoding algorithm for each data segment 92, the same encoding algorithm for the data segments 92 of a data object, or a combination thereof.

The encoded data segment 94 is of greater size than the data segment 92 by the overhead rate of the encoding algorithm by a factor of X/T, where X is the width or number of slices, and T is the read threshold. In this regard, the corresponding decoding process can accommodate at most X-T missing EC data slices and still recreate the data segment 92. For example, if X=16 and T=10, then the data segment 92 will be recoverable as long as 10 or more EC data slices per segment are not corrupted.

The slicer 79 transforms the encoded data segment 94 into EC data slices in accordance with the slicing parameter from the vault for this user and/or data segment 92. For example, if the slicing parameter is X=16, then the slicer 79 slices each encoded data segment 94 into 16 encoded slices.

The post-slice manipulator 81 performs, if enabled, post-manipulation on the encoded slices to produce the EC data slices. If enabled, the post-slice manipulator 81 determines the type of post-manipulation, which may be based on a computing system-wide predetermination, parameters in the vault for this user, a table lookup, the user identification, the type of data, security requirements, available DSN memory, performance requirements, control unit directed, and/or other metadata. Note that the type of post-slice manipulation may include slice level compression, signatures, encryption, CRC, addressing, watermarking, tagging, adding metadata, and/or other manipulation to improve the effectiveness of the computing system.

In an example of a read operation, the post-slice de-manipulator 89 receives at least a read threshold number of EC data slices and performs the inverse function of the post-slice manipulator 81 to produce a plurality of encoded slices. The de-slicer 87 de-slices the encoded slices to produce an encoded data segment 94. The decoder 85 performs the inverse function of the encoder 77 to recapture the data segment 90-92. The pre-slice de-manipulator 83 performs the inverse function of the pre-slice manipulator 75 to recapture the data segment 90-92.

FIG. 5 is a diagram of an example of slicing an encoded data segment 94 by the slicer 79. In this example, the encoded data segment 94 includes thirty-two bits, but may include more or less bits. The slicer 79 disperses the bits of the encoded data segment 94 across the EC data slices in a pattern as shown. As such, each EC data slice does not include consecutive bits of the data segment 94 reducing the impact of consecutive bit failures on data recovery. For example, if EC data slice 2 (which includes bits 1, 5, 9, 13, 17, 25, and 29) is unavailable (e.g., lost, inaccessible, or corrupted), the data segment can be reconstructed from the other EC data slices (e.g., 1, 3 and 4 for a read threshold of 3 and a width of 4).

Figure 6:
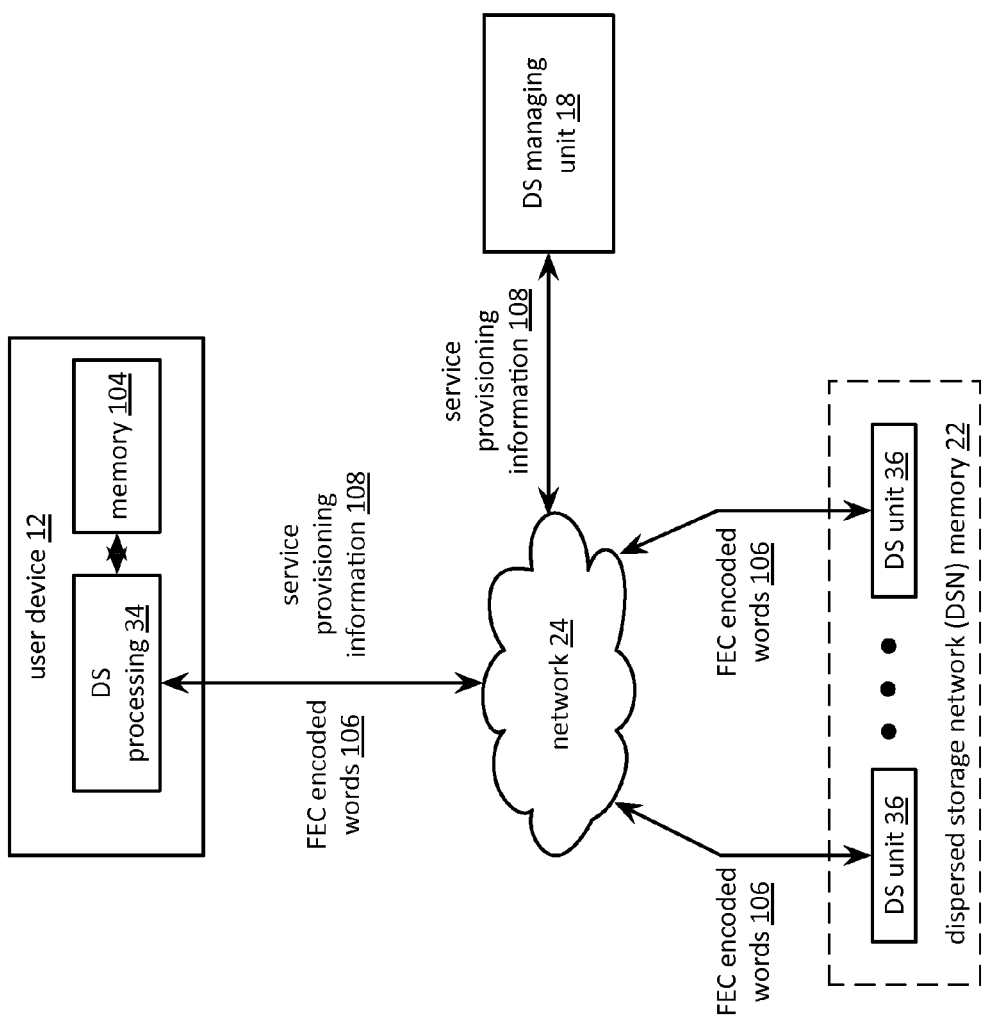
FIG. 6 is a schematic block diagram of another embodiment of a computing system in accordance with the invention.

FIG. 6 is a schematic block diagram of another embodiment of a computing system that includes a user device 12, a dispersed storage (DS) managing unit 18, a network 24, and a dispersed storage network (DSN) memory 22. The network 24 couples the user device 12, the DS managing unit 18, and the DSN memory 22. The DSN memory 22 includes a plurality of DS units 36. Alternatively, The DSN memory 22 may include one or more of a local memory of the user device 12, a memory of a storage service provider, a plurality of DSN memories 22, and a network coupled memory unit. The user device 12 includes a DS processing 34 and a hash table 104.

The DS unit 36 functions include receiving forward error correcting (FEC) encoded words 106 via the network 24 for storage in a memory of the DS unit 36. For example, DS unit 36 may receive a write request message from the user device 12, wherein the message includes FEC encoded words 106 and an address to store the FEC encoded words. The DS unit 36 functions may further include receiving a read request message from the user device 12, wherein the message includes an address to retrieve a FEC encoded word 106 from and output to the user device 12.

The DS managing unit 18 functions to communicate service provisioning information 108 with the user device 12 and/or the DSN memory 22 via the network 24. The DS managing unit 18 may be affiliated with one DSN memory 22 of a plurality of DSN memories 22. For example, a first DS managing unit 18 and a first DSN memory 22 may be affiliated with each other as part of a first dispersed storage service provider. As another example, a second DS managing unit 18 and a second DSN memory 22 may be affiliated with each other as part of a second dispersed storage service provider.

The service provisioning information 108 may includes an allocation of storage addresses request and an associated allocation of storage addresses response. For example, the DS managing unit 18 receives the allocation of storage addresses request from the user device 12, determines an allocation of storage addresses, and sends an allocation of storage address response that includes the allocation of storage addresses. For instance, the DS managing unit 18 selects a plurality of DS units 36 and addresses and/or address ranges of the DS units 36 to determine the allocation of storage addresses. The selection of DS units may be based on one or more of storage preferences included in the allocation of storage addresses request, previously assigned DS units 36, previously assigned addresses or address ranges, DS unit available memory, DS unit memory utilization, DS unit performance, DS unit capabilities, a user identifier (ID), a lookup, a command, and a message. The DS managing unit 18 sends the allocation of storage addresses response to the user device 12 to facilitate assignment of DS units and addresses to support storage needs of user device 12.

The user device 12 communicates service provisioning information 108 to and from the DS managing unit 18 to request allocation of DS unit resources (e.g., dispersed storage memory) and addresses. The user device 12 communicates request messages (e.g., write, read, delete, list, etc.) and FEC encoded words 106 with one or more DS units 36 in accordance with the service provisioning information 108. The user device 12 may access FEC encoded words 16 in the plurality of DS units 36 by communicating allocated addresses to and from the plurality of DS units 36 rather than utilizing a virtual DSN address such as a slice name and/or a source name. The DS unit 36 utilizes the allocated address to access slices on behalf of the user device 12. For example, the allocated address is a physical address of a memory device within the DS unit 36. As another example, the allocated address is a virtual address within the DS unit 36 such that the virtual address is substantially not the same as the virtual DSN addressing (e.g., not a slice name and/or a source name).

The user device 12 utilizes the hash table 104 to store routing information and/or integrity check information. The routing information includes one or more of virtual DSN address to physical location (e.g., a DS unit identifier) information, an allocated address range, a data identifier, and a word name corresponding to an FEC encoded word. For example, the routing information indicates that an FEC encoded word corresponding to word name 10F5 is stored in DS unit 4 at address 403F2D. The integrity check information may include an integrity check value corresponding to data and/or an integrity check value corresponding to an FEC encoded word. The integrity check value may be generated as one or more of a hash of data stored in a hash of an FEC encoded word.

In an example of a storage operation, the user device 12 determines storage preferences and sends an allocation of storage addresses request to the DS managing unit 18. The device 12 receives an allocation of storage addresses response and stores information from the response in the hash table 104. The user device 12 determines to store a data segment, generates a hash of the data segment as an integrity check value, and stores the hash and an associated data name in the hash table 104. The user device 12 creates FEC encoded words based on the data segment. The user device 12 sends a write request message, wherein the message includes a storage address retrieved from the hash table 104 and an FEC encoded word to the DS units 36 for storage therein.

In an example of a retrieval operation, the user device 12 determines storage addresses based on routing information stored in the hash table 104 corresponding to desired data. The user device 12 sends a read request message to the DS unit 36, wherein the message includes including a storage address. The user device 12 receives a FEC encoded word and calculates a hash of FEC encoded word. The user device 12 verifies integrity of the FEC encoded word by comparing the calculated hash of the FEC encoded word to a stored hash (e.g., of an original store sequence) retrieved from the hash table 104. The user device 12 determines that integrity is favorable when the comparison indicates that the calculated hash and the stored hash are substantially the same. The user device 12 utilizes the FEC encoded word in decoding a subsequent decode threshold number of FEC encoded words to reproduce the desired data. The method of operation of the system is discussed in greater detail with reference to FIGS. 7-13.

Figure 7:
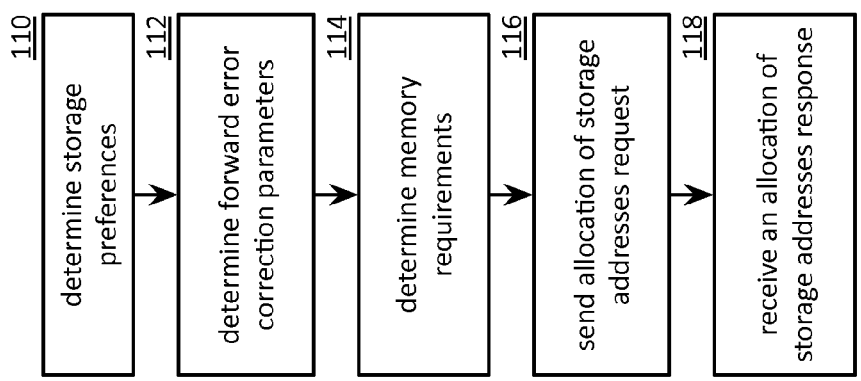
FIG. 7 is a flowchart illustrating an example of acquiring storage addresses in accordance with the invention.

FIG. 7 is a flowchart illustrating an example of acquiring storage addresses. The method begins with step 110 where a processing module (e.g., a user device) determines storage preferences, which include requirements related to one or more of reliability, availability, performance, security, cost, capability, a memory amount, and capacity. Such a determination may be based on one or more of a basic input output system (BIOS) look up, a data type, data to be stored, amount of data to be stored, a user identifier (ID), a user preference table lookup, an operating system (OS) parameter, a command, and a message. For example, the processing module determines storage preferences to include utilization of six dispersed storage (DS) units and a total amount of memory of 100 gigabytes based on an amount of data to be stored and a reliability preference.

The method continues at step 112 where the processing module determines forward error correction parameters, which includes a pillar width, a decode threshold, a read threshold, a write threshold, an encoding method, an encoding matrix, and a slicing method. Such a determination may be based on one or more of the storage preferences, a basic input output system (BIOS) look up, a data type, data to be stored, amount of data to be stored, a user ID, a user preference table lookup, and error coding dispersal storage function parameter table lookup, an operating system (OS) parameter, a command, and a message. For example, the processing module determines a pillar width of 6, a decode threshold of 4, and a write threshold of 5 based on the storage preferences.

The method continues at step 114 where the processing module determines memory requirements, which includes one or more of a number of memories, size of memories, estimated mean time to failure, estimated mean time to repair, cost, access latency, bandwidth capacity, power availability, and physical security. Such a determination may be based on one or more of the forward error correction parameters, the storage preferences, a basic input output system (BIOS) look up, a data type, data to be stored, amount of data to be stored, a user ID, a user preference table lookup, and error coding dispersal storage function parameter table lookup, an operating system (OS) parameter, a command, and a message. For example, the processing module determines the memory requirements to include six 1 terabyte (TB) memories when the forward error correction parameters include a pillar width of six and storage preferences includes a 3 TB of storage requirement.

The method continues at step 116 where the processing module sends an allocation of storage addresses request to a memory allocating entity (e.g., a DS managing unit, a storage service provider, a private network memory allocation server). The allocation of storage addresses request includes one or more of a user identifier (ID), a user device ID, the memory requirements, an estimated number of bytes to be stored, the forward error correction parameters, and the storage preferences. The memory allocating entity processes the request to determine an allocation of storage addresses. The memory allocating entity sends an allocation of storage addresses response to the processing module, wherein the response includes the allocation of storage addresses.

The method continues at step 118 where the processing module receives the allocation of storage addresses response. The processing module stores (e.g., in a local memory, in a hash table) information from the response including one or more of memory addresses, a storage service provider portal address, internet protocol (IP) addresses, number of memories, memory identifiers, size of memories, allocated memory, performance limitations, capability limitations, cost, availability, access latency, bandwidth capacity, power availability, physical security, and an estimated of quality of service. Utilization of memory is discussed in greater detail with reference to FIGS. 8A-13. The method described above with reference to FIG. 7 may be executed by the processing module in advance of utilizing the storage addresses for subsequent storage and retrieval sequences.

Figure 8B:
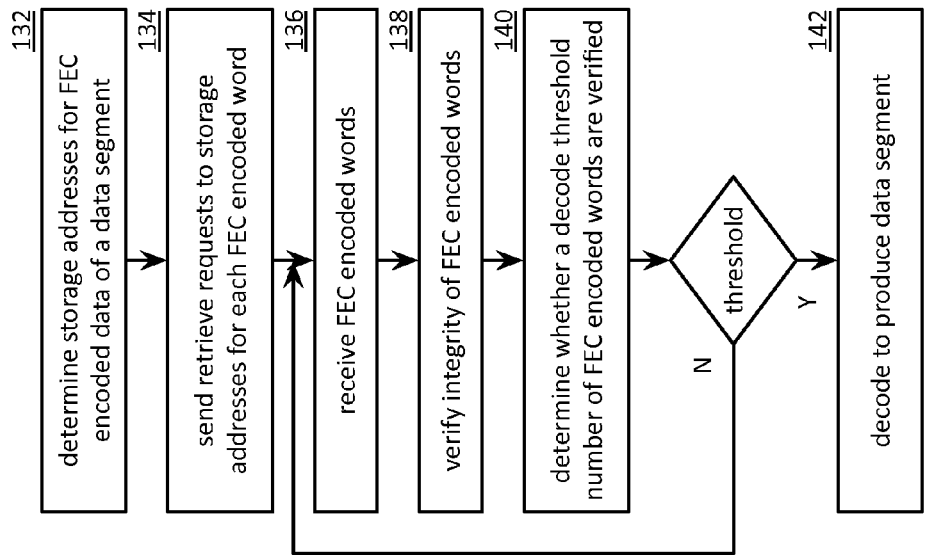
FIG. 8B is a flowchart illustrating an example of retrieving data in accordance with the invention.
Figure 8A:
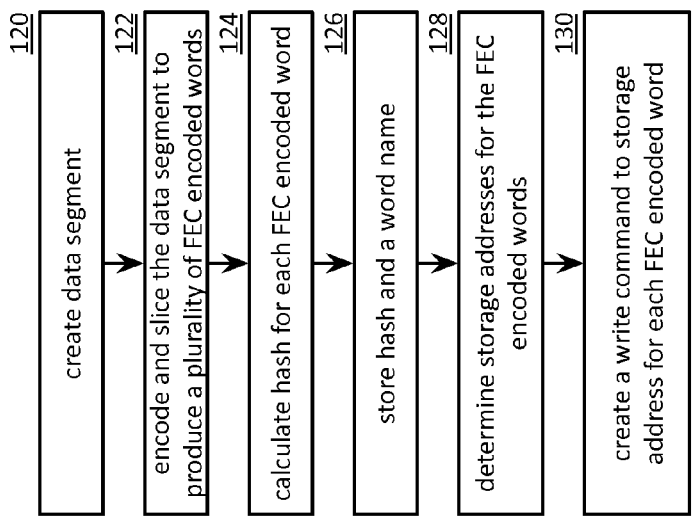
FIG. 8A is a flowchart illustrating an example of storing data in accordance with invention.

FIG. 8A is a flowchart illustrating an example of storing data. The method begins with step 120 where a processing module (e.g., of a user device) creates a data segment of a portion of data and a source name for the data segment. The method continues at step 122 where the processing module forward error correction (FEC) encodes and divides the data segment to produce a plurality FEC encoded words. The method continues at step 124 where the processing module calculates a deterministic mathematical function (e.g., an integrity check hash) for each FEC encoded word. The deterministic mathematical function may include one or more of a hashing function, an encryption function, an algebraic formula, and an offset. For example, the processing module calculates a hash for each FEC encoded word to produce an integrity check hash for each FEC encoded word. The method continues at step 126 where the processing module stores the hash and the word name in a local memory (e.g., a hash table) to enable subsequent verification of integrity of retrieved FEC encoded words.

The method continues at step 128 where the processing module determines storage addresses for the FEC encoded words. Such a determination includes retrieving the storage addresses (e.g., from the hash table) and requesting the storage addresses (e.g., from an address allocation entity). The method continues at step 130 where the processing module creates a write request to the storage addresses for each FEC encoded word, wherein the request includes the storage addresses and the FEC encoded words. The creation of the write request includes one or more of sending a write command to a storage service provider portal, a DS unit IP address, and a memory device address.

FIG. 8B is a flowchart illustrating an example of retrieving data. The method begins with step 132 where a processing module (e.g., of a user device) determines storage addresses for forward error correction (FEC) encoded words of a data segment to be retrieved. Such a determination may be based on one or more of retrieving the storage addresses (e.g., from a hash table) and requesting the storage addresses from a memory allocation entity. The method continues at step 134 where the processing module sends a retrieve request to the storage addresses for FEC encoded word. The sending includes outputting the retrieve request to one or more of a storage service provider portal, a dispersed storage (DS) unit Internet protocol (IP) address, a DS unit address, and a memory device address.

The method continues at step 136 where the processing module receives FEC encoded words. The method continues at step 138 where the processing module verifies integrity of FEC encoded words by comparing a stored hash retrieved from a local memory to a calculated hash of a received FEC encoded word. The processing module verifies integrity of the FEC encoded word when the comparison indicates that the stored hash is substantially the same as the calculated hash.

The method continues at step 140 where the processing module determines whether a decode threshold number of received FEC encoded words are verified. The method repeats back to step 136 when the processing module determines that the decode threshold number of received FEC encoded words are not verified so far. The method continues to step 142 when the processing module determines that the decode threshold number of received FEC encoded words are verified.

The method continues at step 142 where the processing module decodes the FEC encoded words to produce the desired data segment. The decoding may not include utilizing non-verified FEC encoded words that failed integrity verification. The method may continue as described above to produce all data segments associated with the data to reproduce the data.

FIG. 9A is another flowchart illustrating another example of storing data. The method begins with step 144 where a processing module (e.g., of a user device) forward error correction (FEC) encodes data (e.g., utilizing Reed-Solomon encoding) to produce FEC encoded data. The method continues at step 146 where the processing module divides (e.g., slices) the FEC encoded data into a set of FEC encoded words. The encoding and dividing may be included in an integrated step (e.g., dispersed storage error encoding).

The method continues at step 148 where the processing module generates integrity information based on the data. The generating includes at least one of performing a hash algorithm on the data to produce the integrity information (e.g., message digest (MD)-5, secure hash algorithm (SHA)-1, SHA-256, SHA 512), performing a hash-based message authentication code (HMAC) on the data to produce the integrity information (e.g., HMAC-MD-5), performing a parity function on the data to produce the integrity information, performing a cyclic redundancy check function on the data to produce the integrity information, and performing a mask generating function (MGT) on the data to produce the integrity information.

The method continues at step 150 where the processing module generates a word name for each FEC encoded word of the set of FEC encoded words. The word name may include one or more of a word name index, vault identifier (ID), a vault generation ID, a data ID, and a data segment ID. The method continues at step 152 where the processing module affiliates an address of allocated address space of a dispersed storage memory with the word name. The dispersed storage memory includes at least one of a local memory of a device executing the method, a memory of a storage service provider, and a network coupled memory unit. The affiliating includes at least one of selecting the address based on the size of a FEC encoded word, selecting a next available address as the address, utilizing a received address as the address.

The method continues at step 154 where the processing module stores the integrity information, the word name, and the address. The storing includes one or more of storing the integrity information, the word name, and the address in a local memory and sending the integrity information, the word name, and the address to a dispersed storage memory for storage therein.

The method continues at step 156 where the processing module creates a write command to store the FEC encoded word at the address in the dispersed storage memory. The creation of a write command includes at least one of determining whether to store the FEC encoded word in the local memory, the memory of the storage service provider, or the network coupled memory unit; creating a write signal; and sending a write request message. When storing the FEC encoded word in the local memory, the processing module determines available local memory addresses of the allocated address space of the local memory and selects one of the available local memory addresses as the address. When storing the FEC encoded word in the memory of the storage service provider, the processing module determines available service provider memory addresses of the allocated address space of the memory of the storage service provider and selects one of the available service provider memory addresses as the address. When storing the FEC encoded word in the network coupled memory unit, the processing module determines available network memory addresses of the allocated address space of the network coupled memory unit and selects one of the available network memory addresses as the address.

FIG. 9B is another flowchart illustrating another example of retrieving data. The method begins with step 158 where a processing module (e.g., of a user device) retrieves, for data, integrity information and a set of addresses. The retrieving includes at least one of identifying a set of word names based on the data and utilizing the set of word names to index a table to retrieve the integrity information and the set of addresses. The method continues at step 160 where the processing module creates a set of read commands to retrieve a set of forward error correction (FEC) encoded words from the set of addresses in a dispersed storage memory. The creation of the set of read commands includes one or more of outputting a read signal and sending a read request message.

The method continues at step 162 where the processing module combines at least a decode threshold number of the FEC encoded words to produce FEC encoded data when at least a decode threshold number of the FEC encoded words are retrieved. The method continues at step 164 where the processing module FEC decodes the FEC encoded data (e.g., utilizing a Reed Solomon decoding approach) to produce recaptured data.

The method continues at step 166 where the processing module generates recaptured integrity information based on the recaptured data. The generating of the recaptured integrity information includes at least one of performing a hash algorithm on the recaptured data to produce the integrity information, performing a hash-based message authentication code (HMAC) on the recaptured data to produce the integrity information, performing a parity function on the recaptured data to produce the integrity information, performing a cyclic redundancy check function on the recaptured data to produce the integrity information, and performing a mask generating function (MGT) on the recaptured data to produce the integrity information.

The method continues at step 168 where the processing module compares the recaptured integrity information with the integrity information. The processing module determines that the comparison is favorable when the recaptured integrity information is substantially the same as the integrity information. The method branches to step 172 when the processing module determines that the recaptured integrity information compares favorably with the integrity information. The method continues to step 170 when the processing module determines that the recaptured integrity information compares unfavorably with the integrity information. The method continues at step 170 where the processing module indicates that the recaptured data is invalid when the comparing is unfavorable. The method continues at step 172 where the processing module indicates that the recaptured data is valid when the comparing is favorable.

Figure 10A:
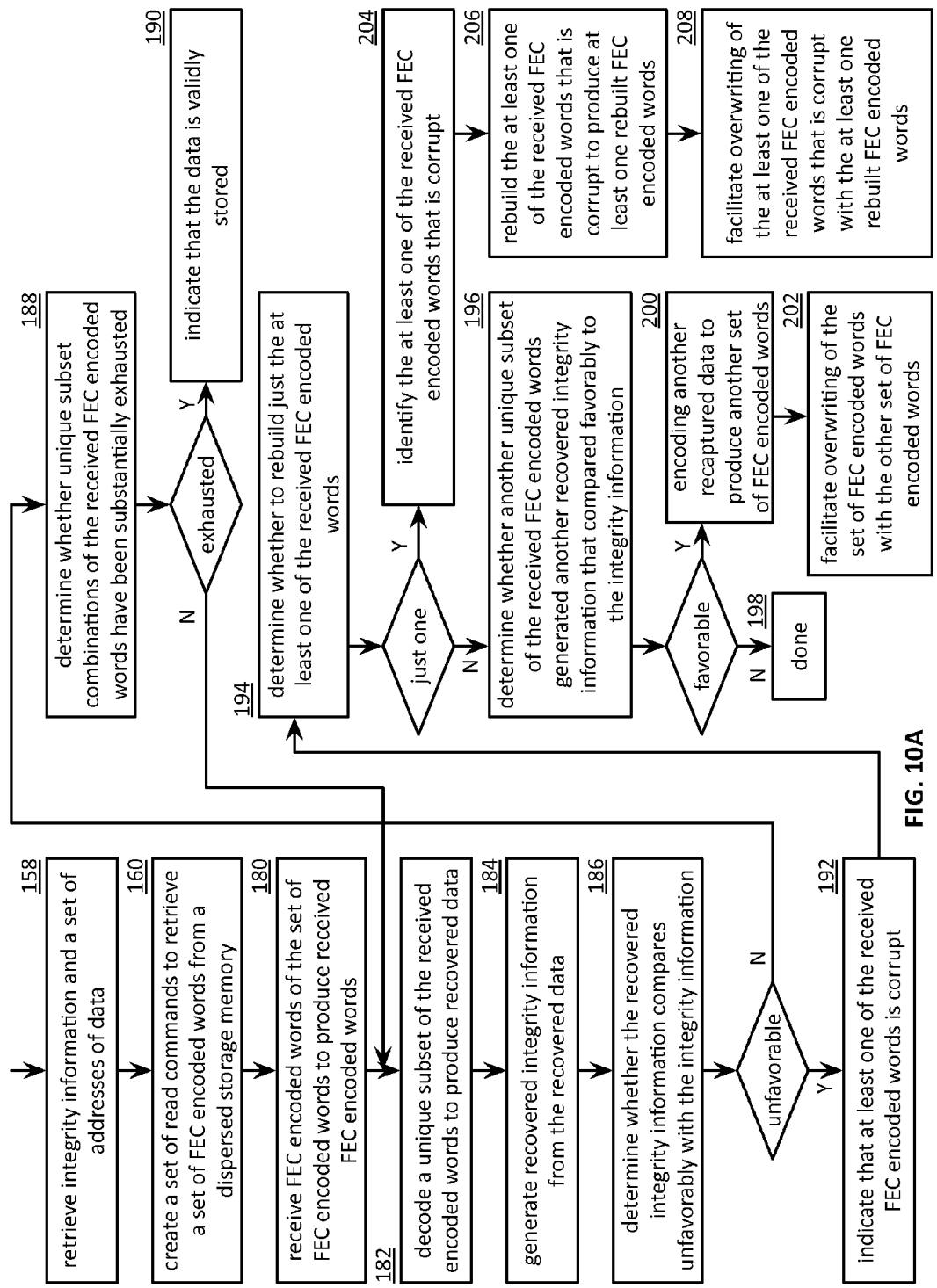
FIG. 10A is a flowchart illustrating an example of verifying data storage in accordance with invention.
Figure 10B:
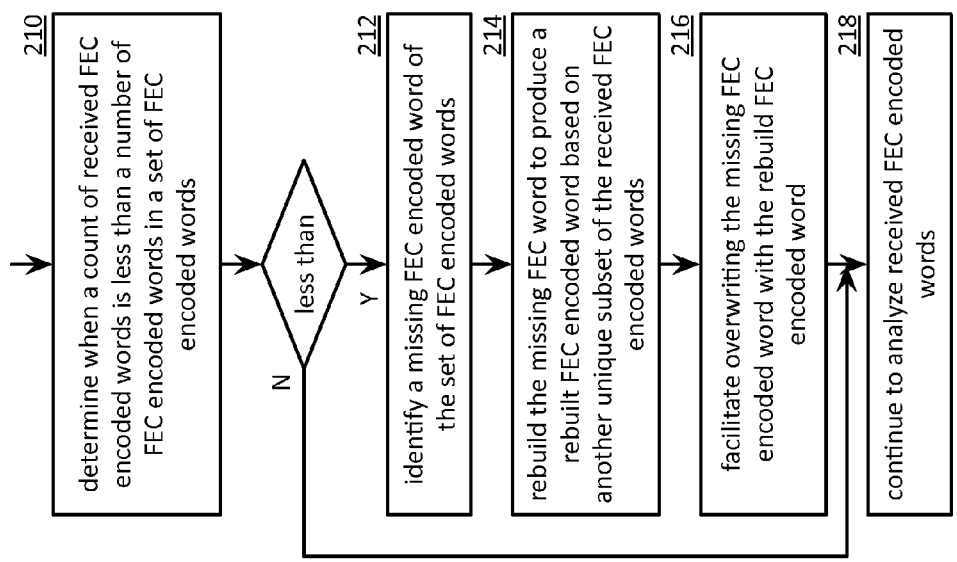
FIG. 10B is a flowchart illustrating an example of replacing missing data in accordance with invention.

FIG. 10 is a flowchart illustrating an example of verifying data storage. The method begins with steps 158-160 FIG. 9B where a processing module (e.g., of a user device) retrieves integrity information and a set of addresses of data that is stored as a set of forward error correction (FEC) encoded words in a dispersed storage memory and creates a set of read commands to retrieve the set of FEC encoded words from the dispersed storage memory, wherein a read command of the set of read commands includes an address of the set of addresses. The method continues at step 180 where the processing module receives FEC encoded words of the set of FEC encoded words from the dispersed storage memory to produce received FEC encoded words. The receiving may include determining whether there is a missing FEC encoded word of the set of FEC encoded words. A method to determine whether there is a missing FEC encoded word is discussed in greater detail with reference to FIG. 10B.

The method continues at step 182 where the processing module decodes a unique subset of the received FEC encoded words to produce recovered data. The decoding includes one or more of combining (e.g., de-slicing) the unique subset of received FEC encoded words to produce FEC encoded data and decoding the FEC encoded data to produce the recovered data in accordance with a dispersed data storage method (e.g. a Reed Solomon decoding algorithm). The method continues at step 184 where the processing module generates recovered integrity information from the recovered data. The generating of the recovered integrity information includes at least one of performing a hash algorithm on the recovered data to produce the recovered integrity information, performing a hash-based message authentication code (HMAC) on the recovered data to produce the recovered integrity information, performing a parity function on the recovered data to produce the recovered integrity information, performing a cyclic redundancy check function on the recovered data to produce the recovered integrity information, and performing a mask generating function (MGT) on the recovered data to produce the recovered integrity information.

The method continues at step 186 where the processing module compares the recovered integrity information with the integrity information to determine whether the recovered integrity information compares unfavorably with the integrity information. The processing module determines that the comparison is favorable when the recovered integrity information is substantially the same as the integrity information. The method branches to step 188 when the processing module determines that the recovered integrity information compares favorably with the integrity information. The method continues to step 192 when the processing module determines that the recovered integrity information compares unfavorably with the integrity information.

The method continues at step 188 where the processing module determines whether unique subset combinations of the received FEC encoded words have been substantially exhausted. The unique subset combinations include combinations of a decode threshold number of the received FEC encoded words. The method loops back to step 182 when the processing module determines that the unique subset combinations of the received FEC encoded words have not been substantially exhausted to repeat the loop for another unique subset of the unique subset combinations. The method continues to step 190 when the processing module determines that the unique subset combinations of the received FEC encoded words have been substantially exhausted. The method continues at step 190 where the processing module indicates that the data is validly stored in the dispersed storage memory.

The method continues at step 192 where the processing module indicates that at least one of the received FEC encoded words of the unique subset of the received FEC encoded words is corrupt when the recovered integrity information compares unfavorably with the integrity information. The method continues at step 194 where the processing module determines whether to rebuild just the at least one of the received FEC encoded words. Such a determination may be based on one or more of a number of received FEC encoded words, a pillar width, a message, a capacity indicator, a system activity indicator, and a predetermination. For example, the processing module determines not to rebuild just the at least one of the received FEC encoded words (e.g., to rebuild all FEC encoded words of the set of encoded words) when the system activity indicator is below an activity threshold. The method branches to step 204 when the processing module determines to rebuild just the at least one of the received FEC encoded words. The method continues to step 196 when the processing module determines not to rebuild just the at least one of the received FEC encoded words.

The method continues at step 196 where the processing module determines whether another unique subset of the received FEC encoded words generated another recovered integrity information that compared favorably to the integrity information. The method branches to step 200 when the processing module determines that another unique subset of the received FEC encoded words generated another recovered integrity information that compared favorably to the integrity information. The method continues to steps 198 when the processing module determines that another unique subset of the received FEC encoded words did not generate another recovered integrity information that compared favorably to the integrity information. The method continues at step 198 where the method ends.

The method continues at step 200 where the processing module encodes another recaptured data to produce another set of FEC encoded words, wherein the other unique subset of the received FEC encoded words is decoded to produce the other recaptured data when the other recovered integrity information compared favorably to the integrity information. The method continues at step 202 where the processing module facilitates overwriting of the set of FEC encoded words with the other set of FEC encoded words within the dispersed storage memory. For example, the processing module creates a write command to store the FEC encoded word at a corresponding address of the set of addresses in the dispersed storage memory.

The method continues at step 204 where the processing module identifies the at least one of the received FEC encoded words of the unique subset of the received FEC encoded words that is corrupt based on other unique subsets of the received FEC encoded words when the processing module determines to rebuild just the at least one of the received FEC encoded words. The identifying includes decoding the other unique subsets of the received FEC encoded words to produce corresponding recovered data, generating corresponding recovered integrity information from the corresponding recovered data, comparing the corresponding recovered integrity information to the integrity information to produce corresponding comparisons, identifying a received FEC encoded word associated with unfavorable corresponding comparisons as the at least one of the received FEC encoded words that is corrupt. A number of the other unique subsets of the received FEC encoded words may be determined in accordance with a formula: number of subsets=received number of FEC encoded words choose decode threshold. For example, a number of subsets=10=5 choose 3, when a pillar width number of 5 FEC encoded words are received and a decode threshold is 3. As such, 10 other unique subsets of the received FEC encoded words produce 10 corresponding variants of recovered data, 10 corresponding variants of recovered integrity information, and 10 corresponding variants of comparisons. For example, the processing module identifies a second FEC encoded word (e.g., pillar 2) as the at least one of the received FEC encoded words that is corrupt when all six comparisons associated with the second FEC encoded word are unfavorable and all four comparisons not associated with the second FEC encoded word are favorable.

The method continues at step 206 where the processing module rebuilds the at least one of the received FEC encoded words of the unique subset of the received FEC encoded words that is corrupt based on at least one of the other unique subsets of the received FEC encoded words to produce at least one rebuilt FEC encoded words. For example, the processing module decodes the at least one of the other unique subset of the received FEC encoded words to produce recovered data and encodes the recovered data to produce the at least one rebuilt FEC encoded words. The method continues at step 208 where the processing module facilitates overwriting the at least one of the received FEC encoded words of the unique subset of the received FEC encoded words that is corrupt with the at least one rebuilt FEC encoded words.

FIG. 10B is a flowchart illustrating an example of replacing missing data. The method begins with step 210 where processing module (e.g., of a user device) determines whether a count of received forward error correction (FEC) encoded words is less than a number of FEC encoded words in a set of FEC encoded words. For example, the processing module determines that the count of received FEC encoded words is less than the number of FEC encoded words in the set of FEC encoded words when the count of received FEC encoded words is 15 and the set of FEC encoded words includes a pillar width of 16. The method branches to step 218 when the processing module determines that the count of received FEC encoded words is not less than the number of FEC encoded words in the set of FEC encoded words. The method continues to step 212 when the processing module determines that the count of received FEC encoded words is less than the number of FEC encoded words in the set of FEC encoded words.

The method continues at step 212 where the processing module identifies a missing FEC encoded word of the set of FEC encoded words. The identifying includes comparing each received FEC encoded word to a pillar number associated with the set of FEC encoded words. For example, the processing module identifies the missing FEC encoded word as an FEC encoded words associated with pillar 14 when FEC encoded words associated with pillars 1-13, and 15-16 have been received and the pillar width is 16.

The method continues at step 214 where the processing module rebuilds the missing FEC encoded word based on another unique subset of the received FEC encoded words to produce a rebuilt FEC encoded word, wherein the other unique subset of the received FEC encoded words generated another recovered integrity information that compared favorably to integrity information associated with the set of FEC encoded words. The method continues at step 216 where the processing module overwrites the missing FEC encoded word with the rebuilt FEC encoded word. The method continues at step 218 where the processing module continues to analyze received FEC encoded words. The analyzing includes determining whether at least one of the received FEC encoded words is corrupt as previously discussed with reference to FIG. 10A.

Figure 11:
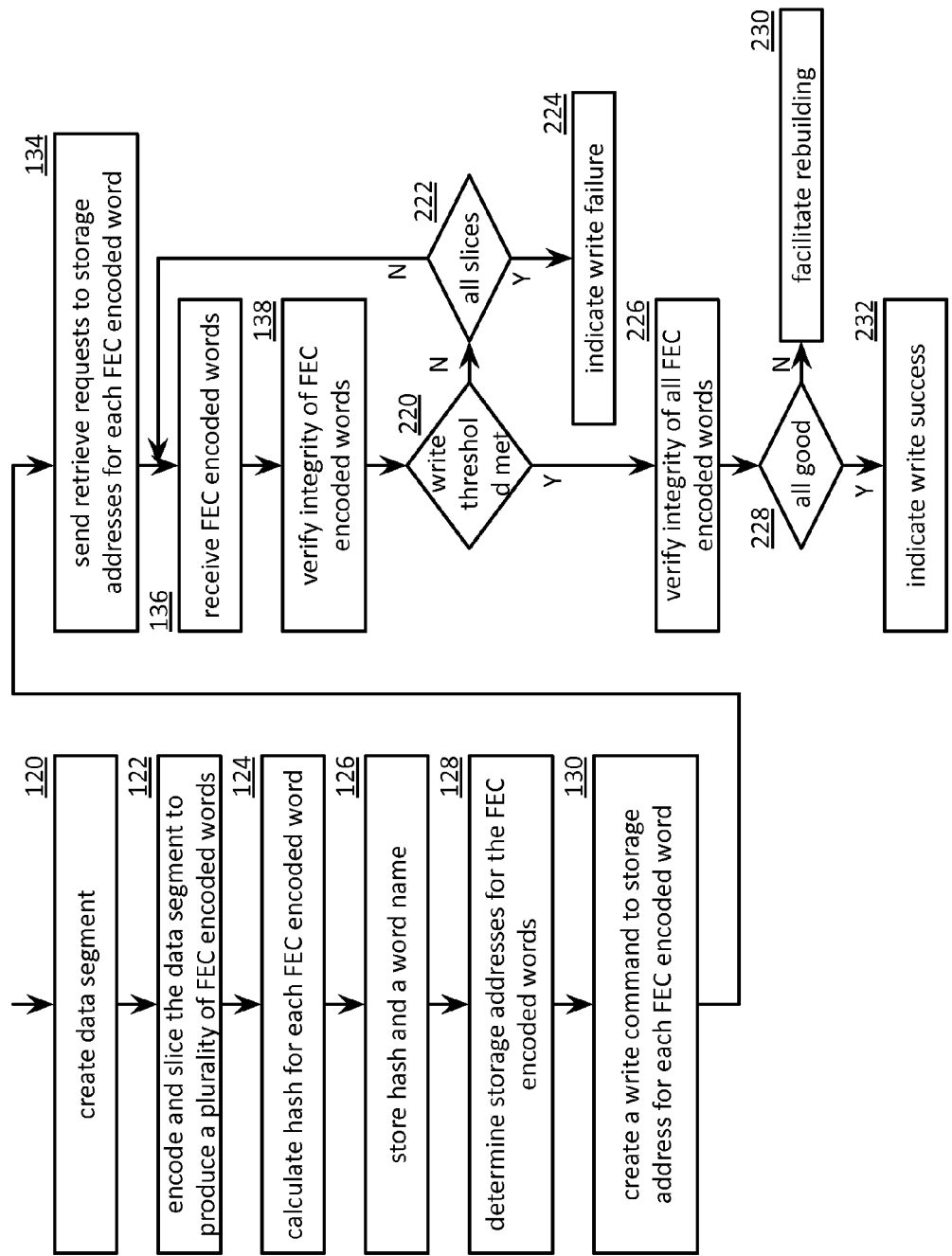
FIG. 11 is another flowchart illustrating another example of verifying data storage in accordance with the invention.

FIG. 11 is another flowchart illustrating another example of verifying data storage. The method begins with steps 120-130 of FIG. 8A where a processing module (e.g., of a user device) creates a data segment, encodes and slices the data segment to produce a plurality of forward error correction (FEC) encoded words, calculates a hash for each FEC encoded word, stores a hash in a word name for each FEC encoded word, determines storage addresses for the FEC encoded words, and creates a write command to storage addresses for each FEC encoded word. The method continues with steps 134-138 of FIG. 8B where the processing module sends retrieve requests to storage addresses for each FEC encoded word, receives FEC encoded words, and verifies integrity of FEC encoded words.

The method continues at step 220 where the processing module determines whether a write threshold number of FEC encoded words have been verified. Such a determination may be based on a comparison of the number of FEC encoded words that have been verified so far to a write threshold number of error coding dispersal storage function parameters. The method branches to step 226 on the processing module determines that a write threshold have been verified. The method continues to step 222 when the processing module determines that a write threshold has not been verified.

The method continues at step 222 where the processing module determines whether all possible FEC encoded words corresponding to a set of FEC encoded words (e.g., same data segment) have been received and verified. The method repeats back to step 136 when the processing module determines that all possible FEC encoded words have not been received and verified. The method continues to step 224 when the processing module determines that all FEC encoded words have been received and verified. The method continues at step 224 where the processing module indicates a write failure when the processing module determines that all FEC encoded words have been received and verified. Such indicating includes sending a write failure message to at least one of a dispersed storage (DS) managing unit, an application, another user device, and a DS unit.

The method continues at step 226 where the processing module continues verifying received FEC encoded words until either a timeout occurs or all of the FEC encoded words have been received and verified. The method continues at step 228 where the processing module determines whether all of the received FEC encoded words were verified as good. The method branches to step 232 and the processing module determines that the FEC encoded words are all good. The method continues to step 230 when the processing module determines that the FEC encoded words are not all good. The method continues at step 230 where the processing module facilitates rebuilding of FEC encoded words by identifying the received FEC encoded words that are not verified and rebuilding the not verified FEC encoded words. The method continues at step 232 where the processing module indicates a write success when the processing module determines that the FEC encoded words are all good. The indication includes sending a write success message to at least one of a dispersed storage (DS) managing unit, another user device, and a DS unit.

Figure 12:
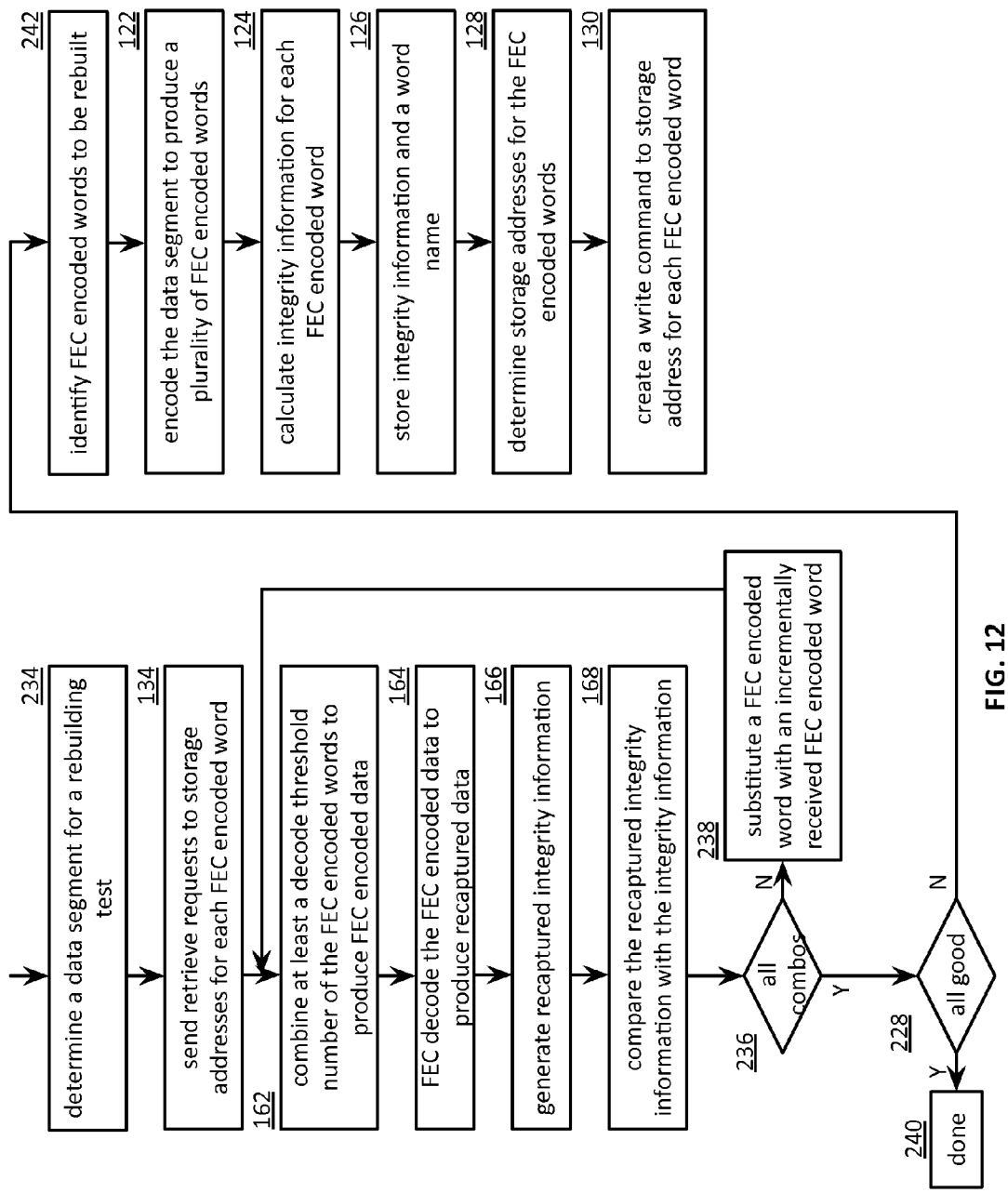
FIG. 12 is a flowchart illustrating an example of rebuilding an encoded data slice in accordance with the invention.

FIG. 12 is a flowchart illustrating an example of rebuilding an encoded data slice, which include similar steps to FIGS. 8A, 8B, 9B, and 11. The method begins with step 234 where a processing module (e.g., of a user device) determines a data segment for a rebuilding test. Such a determination may be based on one or more of an error message, where testing left off last time, a list, a request, a command, and a message. The method continues with step 134 of FIG. 8B where the processing module sends retrieve requests to storage addresses for each FEC encoded word associated with the data segment. The processing module receives FEC encoded words. The method continues with steps 162-169 of FIG. 9B where the processing module combines at least a decode threshold number of the FEC encoded words to produce FEC encoded data, FEC decodes the FEC encoded data to produce recapture data, generates recaptured integrity information, and compares the recaptured integrity information with integrity information of the data segment.

The method continues at step 236 where the processing module determines whether all combinations of FEC encoded words have been decoded and tested for integrity. The method branches to step 228 of FIG. 11 when the processing module determines that all combinations have been decoded and tested. The method continues to step 238 when the processing module determines that all combinations have not been decoded and tested. The method continues at step 238 where the processing module substitutes a FEC encoded word with an incrementally receive FEC encoded word to set up a test another combination. The method loops back to step 162 of FIG. 9B.

The method continues with step 228 of FIG. 11 where the processing module determines whether all of the FEC encoded words are good (e.g., verified. The method branches to step 242 when the processing module determines that all of the FEC encoded words are not good. The method ends at step 240 when the processing module determines that all of the FEC encoded words are good.

The method continues at step 242 where the processing module identifies FEC encoded words to be rebuilt based on determining a pattern of FEC encoded word combinations that lead to verified data segments and to non-verified data segments in the previous steps. For example, the processing module determines that a FEC encoded word corresponding to pillar 3 requires rebuilding when a threshold number of FEC encoded words that included the FEC encoded word corresponding to pillar 3 resulted in a non-verified data segment while other FEC encoded words of other pillars substituted for the FEC encoded word corresponding to pillar 3 produced a verified data segment. The method continues with steps 122-130 of FIG. 8A to rebuild the FEC encoded words to be rebuilt, wherein the processing module encodes the data segment to produce a plurality of FEC encoded words, calculates integrity information for each FEC encoded word, stores the integrity information and a word name, determines storage addresses for the FEC encoded words, and creates a write command to a storage address for each FEC encoded word.

Figure 13:
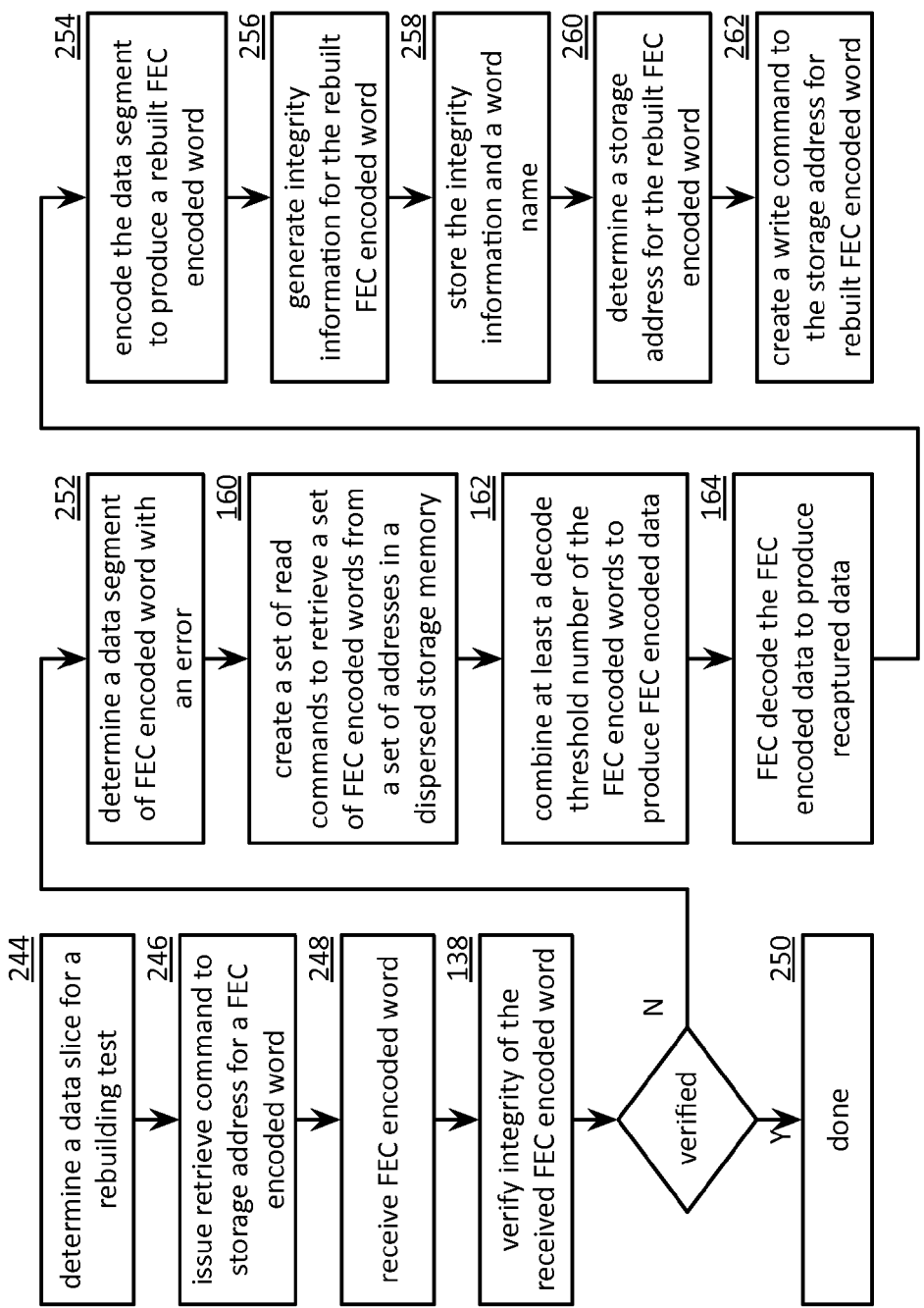
FIG. 13 is another flowchart illustrating another example of rebuilding an encoded data slice in accordance with the invention.

FIG. 13 is another flowchart illustrating another example of rebuilding an encoded data slice, which includes similar steps to FIGS. 8B and 9B. The method begins at step 244 where a processing module (e.g., of a user device) determines a forward error correction (FEC) encoded word for a rebuilding test. Such a determination may be based on one or more of an error message, where testing left off last time, a list, a request, a command, and a message. The method continues at step 246 where the processing module issues a retrieve command to a storage address associated with the FEC encoded word. The method continues at step 248 where the processing module processing module receives a received FEC encoded word.

The method continues with step 138 of FIG. 8B where the processing module verifies integrity of the received FEC encoded word. The method branches to step 252 when the processing module determines that the integrity of the received FEC encoded word is not verified. The method ends at step 250 when the processing module determines that the integrity of the received FEC encoded word is verified.

The method continues at step 252 where the processing module determines a data segment corresponding to the FEC encoded word with the error. Such a determination may be based on one or more of a source name that corresponds to the FEC encoded word, a hash table lookup, a message, and a command. The method continues with steps 16-164 of FIG. 9B where the processing module creates a set of read commands retrieve a set of FEC encoded words from a set of addresses in a dispersed storage memory, combines at least a decode threshold number of retrieved FEC encoded words to produce FEC encoded data, and FEC decodes the FEC encoded data to produce recapture data.

The method continues at step 254 where the processing module encodes the data segment to produce a rebuilt FEC encoded word. The method continues at step 256 the processing module generates integrity information for the rebuilt FEC encoded word. The method continues at step 258 where the processing module stores the integrity information and a word name corresponding to the rebuilt FEC encoded word. The method continues at step 260 where the processing module determines (e.g., a lookup) a storage address for the rebuilt FEC encoded word. The method continues at step 262 where the processing module creates a write command to the storage address for the rebuilt FEC encoded word.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. A method for execution by a processing module, the method comprises:
 retrieving, for a data segment of a data file, integrity information and a set of addresses, wherein the data file is segmented into a plurality of data segments, wherein the plurality of data segments of the data file are dispersed error encoded in accordance with an error coding dispersal storage function to generate sets forward error correction (FEC) encoded words, wherein the error coding dispersal storage function specifies parameters including a pillar number, a read threshold, and a write threshold, wherein each set of FEC encoded words includes a pillar number of FEC encoded words, wherein a decode threshold number of FEC encoded words that is less than a total number of FEC encoded words in a set of FEC encoded words are needed to recover the data segment, wherein a read threshold number of FEC encoded words provides for reconstruction of the data segment, wherein a write threshold number of FEC encoded words provides for a successful transfer of the set of FEC encoded words from a first at least one location in a dispersed storage memory to a second at least one location in the dispersed storage memory, and wherein the write threshold is greater than or equal to the read threshold for the pillar number;

creating a set of read commands to retrieve at least the decode threshold number of FEC encoded words based on the set of addresses in the dispersed storage memory;

sending the set of read commands to a set of storage units of the dispersed storage memory, wherein each storage unit includes a processing module and memory, wherein the set of FEC encoded words are distributedly stored in the set of storage units of the dispersed storage memory;

when the at least the decode threshold number of FEC encoded words are retrieved from at least some of the set of storage units:

decoding the at least the decode threshold number of FEC encoded words to produce a recaptured data segment;

generating recaptured integrity information based on the recaptured data segment;

comparing the recaptured integrity information with the integrity information; and when the comparing is favorable, indicating that the recaptured data segment is valid.

2. The method of claim 1 further comprises:

identifying a set of word names based on the data segment; and utilizing the set of word names to index a table to retrieve the integrity information and the set of addresses.

3. The method of claim 1, wherein the dispersed storage memory comprises at least one of:

a local memory of a device executing the method;

a memory of a storage service provider; and a network coupled memory unit.

4. The method of claim 1, wherein the generating the recaptured integrity information comprises at least one of:

performing a hash algorithm on the recaptured data segment to produce the integrity information;

performing a hash-based message authentication code (HMAC) on the recaptured data segment to produce the integrity information;

performing a parity function on the recaptured data segment to produce the integrity information;

performing a cyclic redundancy check function on the recaptured data segment to produce the integrity information; and performing a mask generating function (MGT) on the recaptured data segment to produce the integrity information.

5. A computer comprises:

an interface;

a memory; and a processing module operably coupled to the interface and the memory, wherein the processing module is operable to:

retrieve, for a data segment of a data file, integrity information and a set of addresses, wherein the data file is segmented into a plurality of data segments, wherein the plurality of data segments of the data file are dispersed error encoded in accordance with an error coding dispersal storage function to generate sets forward error correction (FEC) encoded words, wherein the error coding dispersal storage function specifies parameters including a pillar number, a read threshold, and a write threshold, wherein each set of FEC encoded words includes a pillar number of FEC encoded words, wherein a decode threshold number of FEC encoded words that is less than a total number of FEC encoded words in a set of FEC encoded words are needed to recover the data segment, wherein a read threshold number of FEC encoded words provides for reconstruction of the data segment, wherein a write threshold number of FEC encoded words provides for a successful transfer of the set of FEC encoded words from a first at least one location in a dispersed storage memory to a second at least one location in the dispersed storage memory, and wherein the write threshold is greater than or equal to the read threshold for the pillar number;

create a set of read commands to retrieve at least the decode threshold number of FEC encoded words based on the set of addresses in the dispersed storage memory;

send the set of read commands to a set of storage units of the dispersed storage memory, wherein each storage unit includes a processing module and memory, wherein the set of FEC encoded words are distributedly stored in the set of storage units of the dispersed storage memory;

when the at least the decode threshold number of FEC encoded words are retrieved from at least some of the set of storage units:

decode the at least the decode threshold number of FEC encoded words to produce a recaptured data segment;

generate recaptured integrity information based on the recaptured data segment;

compare the recaptured integrity information with the integrity information; and when the comparing is favorable, indicate that the recaptured data segment is valid.

6. The computer of claim 5, wherein the processing module further functions to:

identify a set of word names based on the data segment; and utilize the set of word names to index a table to retrieve the integrity information and the set of addresses.

7. The computer of claim 5, wherein the dispersed storage memory comprises at least one of:

a local memory;

a memory of a storage service provider; and a network coupled memory unit.

8. The computer of claim 5, wherein the processing module functions to generate the recaptured integrity information by at least one of:

performing a hash algorithm on the recaptured data segment to produce the integrity information;

performing a hash-based message authentication code (HMAC) on the recaptured data segment to produce the integrity information;

performing a parity function on the recaptured data segment to produce the integrity information;

performing a cyclic redundancy check function on the recaptured data segment to produce the integrity information; and performing a mask generating function (MGT) on the recaptured data segment to produce the integrity information.

\* \* \* \* \*